(12) United States Patent
Judge et al.

(10) Patent No.: US 7,178,888 B2
(45) Date of Patent: *Feb. 20, 2007

(54) CONTROLLER FOR A QUICK DISCONNECT SLIDE ASSEMBLY

(76) Inventors: Ronald J. Judge, 3011 Manchester Cir., Corona, CA (US) 92879; Adam M. Lyons, 46 Paseo Del Sol, Rancho Santa Margarita, CA (US) 92688; Ted D. Alba, 13242 Droxford St., Cerritos, CA (US) 90703

( * ) Notice: Subject to any disclaimer, the term of this patent is extended or adjusted under 35 U.S.C. 154(b) by 0 days.

This patent is subject to a terminal disclaimer.

(21) Appl. No.: 10/996,300

(22) Filed: Nov. 22, 2004

(65) Prior Publication Data
US 2005/0062379 A1   Mar. 24, 2005

Related U.S. Application Data

(63) Continuation of application No. 10/704,177, filed on Nov. 7, 2003, now Pat. No. 6,820,954, which is a continuation of application No. 10/028,030, filed on Dec. 19, 2001, now Pat. No. 6,655,763.

(60) Provisional application No. 60/257,909, filed on Dec. 22, 2000.

(51) Int. Cl.
A47B 88/04 (2006.01)
(52) U.S. Cl. .............................. 312/334.46; 312/334.44
(58) Field of Classification Search ............. 312/330.1, 312/334.1, 334.7, 334.8, 334.11, 334.16, 312/334.17, 334.44, 334.49, 333, 350, 334.46; 384/18, 20, 21
See application file for complete search history.

(56) References Cited

U.S. PATENT DOCUMENTS

| 2,277,702 A | 3/1942 | Kennedy |
| 3,129,981 A | 4/1964 | Meyer |
| 3,650,578 A | 3/1972 | Del Vecchio et al. |
| 3,801,166 A | 4/1974 | York |

(Continued)

FOREIGN PATENT DOCUMENTS

DE        2707365 A    8/1978

(Continued)

OTHER PUBLICATIONS

Civil Docket for US District Court, Central District of California for Case No. SACV04-1365 DOC (SHx), as of Aug. 10, 2005.

(Continued)

*Primary Examiner*—James O. Hansen
(74) *Attorney, Agent, or Firm*—Knobbe, Martens, Olson & Bear, LLP

(57) ABSTRACT

A slide assembly includes an inner slide segment, an intermediate slide segment, and an outer slide segment. A bearing assembly is provided between the inner slide segment and the intermediate slide segment. Preferably, a lock arm extends from the outer slide segment and is engageable with an engagement surface of the intermediate slide segment to limit movement of the intermediate slide segment with respect to the outer slide segment. A latch is associated with the intermediate slide segment and comprises a locking portion. The locking portion is selectively engageable with the bearing assembly to limit movement of the bearing assembly.

18 Claims, 20 Drawing Sheets

U.S. PATENT DOCUMENTS

| | | | | |
|---|---|---|---|---|
| 3,904,254 | A | | 9/1975 | Hagen et al. |
| 4,200,342 | A | * | 4/1980 | Fall .............................. 384/19 |
| 4,560,212 | A | | 12/1985 | Papp et al. |
| 4,998,828 | A | * | 3/1991 | Hobbs .......................... 384/18 |
| 5,472,272 | A | | 12/1995 | Hoffman |
| 5,722,750 | A | | 3/1998 | Chu |
| 5,757,109 | A | | 5/1998 | Parvin |
| 5,851,059 | A | | 12/1998 | Cirocco |
| 5,871,265 | A | | 2/1999 | Stewart et al. |
| 6,145,945 | A | | 11/2000 | Parvin |
| 6,199,967 | B1 | | 3/2001 | Bayles et al. |
| 6,254,210 | B1 | | 7/2001 | Parvin |
| 6,296,338 | B1 | | 10/2001 | Stijns |

FOREIGN PATENT DOCUMENTS

| | | |
|---|---|---|
| DE | 22 17 853 | 10/1979 |
| EP | 583978 A1 | 2/1994 |

OTHER PUBLICATIONS

US District Court, Central District of California, Jonathan Mfg. Corp.'s Complaint for Patent Infringement of U.S. Patent No. 6,820,954, filed Nov. 23, 2004.

US District Court, Central District of California, Central Industrial Supply Co.'s Answer To Complaint, filed Dec. 14, 2004.

US District Court, Central District of California, King Slide Works Co.'s Opposition To Plaintiff's Motion To Amend Order Granting Preliminary Injunction, filed Apr. 18, 2005.

US District Court, Central District of California, Declaration of Chun-Chiang Wang In Opposition To Plaintiff's Motion To Amend Order Granting Preliminary Injunction, filed Apr. 18, 2005.

US District Court, Central District of California, Hewlett-Packard Co.'s Opposition to Plaintiff's Motion To Amend Preliminary Injunction Order, filed Apr. 18, 2005.

US District Court, Central District of California, Declaration of Kelly Smith in support of Hewlett-Packard Co.'s Opposition to Plaintiff's Motion To Amend Preliminary Injunction Order, filed Apr. 18, 2005.

Notebook pages of Craig Lauchner, Engineer for Hewlett-Packard, p. 31-32.

U.S. District Court, Central District of California, Memorandum of Points and Authorities in Support of Plaintiff's Motion for a Preliminary Injunction.

U.S. District Court, Central District of California, Declaration of Clark W. Higgins in Support of Plaintiff's Motion for a Preliminary Injunction.

U.S. District Court, Central District of California, Declaration of David R. Yost, Jr. in Opposition to Plaintiff's Motion for a Preliminary Injunction, Jan. 13, 2005.

U.S. District Court, Central District of California, Plaintiff's Reply to Defendant's Opposition to Motion for Preliminary Injunction, Jan. 28, 2005.

U.S. District Court, Central District of California, Order Granting Preliminary Injunction, Feb. 7, 2005.

Memorandum of Points and Authorities in Support of Plaintiff's Motion to Amend the Order Granting Preliminary Injunction, Mar. 21, 2005.

U.S. District Court, Central District of California, Declaration of Clark W. Higgins in Support of Plaintiff's Motion to Amend the Order Granting Preliminary Injunction, Mar. 21, 2005.

U.S. District Court, Central District of California, Memorandum of Points and Authorities in Opposition of Plaintiff's Motion to Amend the Order Granting a Preliminary Injunction, Mar. 28, 2005.

U.S. District Court, Central District of California, Expert Report of Scott Meek Submitted by Jonathan Manufacturing Corporation, Apr. 13, 2005.

U.S. District Court, Central District of California, Designation of Scott Meek as a Rebuttal Expert Witness; and Preliminary Rebuttal Expert Report of Scott Meek Submitted by Jonathan Manufacturing Corporation, May 27, 2005.

U.S. District Court, Central District of California, (Consolidated ) (Lead Case) King Slide Works Co., Ltd.'s Non-Infringement Charts for Claims 10-23 of U.S. Patent No. 6,820,954, Aug. 10, 2005.

U.S. District Court, Central District of California, Declaration of Lowell Anderson re: Defendant Central Industrial Supply Company's Brief on Claim Construction for the 954 Patent and Memorandum for Invalidity under 112, filed by Defendant Central Industrial Supply Company, (twdb,) (Entered: Sep. 23, 2005).

U.S. District Court, Central District of California, Jonathan Manufacturing Corp.'s *Markman* Brief: Sep. 23, 2005.

U.S. District Court, Central District of California, Jonathan's Opposition to CIS' Motion for Summary Judgment [111], and Motion for Summary Judgment of infringement of claims [109] filed by plaintiff Jonathan Manufacturing Corporation (twdb,) (Entered: Sep. 28, 2005).

U.S. District Court, Central District of California, Declaration of James C. Brooks in support of Jonathan's Motion for Contempt, In Opposition to Defendant's Motion to Dismiss claims on the QS1 and in opposition to defendant's Motion for Summary Judgment [111] filed by Plaintiff Jonathan Manufacturing Corporation (twdb,)(Entered: Sep. 28, 2005).

U.S. District Court, Central District of California, Declaration of Gaetano G. Galletti in Support of Jonathan's opposition to CIS' Motion for Summary Judgment [109] filed by plaintiff Jonathan Manufacturing Corporation (twdb,) (Entered: Sep. 28, 2005).

U.S. District Court, Central District of California, Opposition to Jonathan Manufacturing Corporation's Markman Brief [113] filed by Defendant Central Industrial Supply Company (twdb,) (Entered: Sep. 28, 2005).

U.S. District Court, Central District of California, Opposition to Motion for Summary Judgment of Invalidity of Claims of U.S. Patents 6,820,954 under 35 USC 112 [111] filed by plaintiff Jonathan Manufacturing Corporation (mu,) (Entered: Sep. 29, 2005).

U.S. District Court, Central District of California, Markman Reply Brief filed by Plaintiff Jonathan Manufacturing Corporation (twdb,) (Entered: Oct. 5, 2005).

U.S. District Court, Central District of California, Reply re Motion for Summary Judgment on the QS1 [109] filed by Defendant Central Industrial Supply Company (twdb,) (Entered: Oct. 5, 2005).

U.S. District Court, Central District of California, Reply re Claim Construction and Invalidity Under 112 in Support of Motion for Summary Judgment [111] filed by Defendant Central Industrial Supply Company (twdb,) (Entered: Oct. 5, 2005).

U.S. District Court, Central District of California, Notice of Motion and Motion to Deem an Admission Binding, or in the alternative, Motion for Order to Add Inequitable Conduct, Replace an Expert, and Disqualify Counsel filed by defendant Central Industrial Supply Company, (twdb,) (Entered: Oct. 25, 2005).

U.S. District Court, Central District of California, Declaration of Lowell Anderson re Motion to Deem Admission Binding, or alternative, Motion for Order to Add Inequitable Conduct, Replace an Expert, and Disqualify Counsel [132] filed by defendant Central Industrial Supply Company (twdb,) (Entered: Oct. 25, 2005).

U.S. District Court, Central District of California, Stipulation and Order with Prejudice of all Claims Between Jonathan Manufacturing Corporation and Central Industrial Supply Company by Judge David O. Carter: (Made JS-6. Case Terminated.) (twdb,) (Entered: Nov. 3, 2005).

* cited by examiner

CONTROLLER FOR A QUICK DISCONNECT SLIDE ASSEMBLY

RELATED APPLICATIONS

This application is a continuation of U.S. patent application Ser. No. 10/704,177, filed Nov. 7, 2003, now U.S. Pat. No. 6,820,954 which is a continuation of U.S. patent application Ser. No. 10/028,030, filed Dec. 19, 2001, now U.S. Pat. No. 6,655,763, which claims priority to U.S. Provisional Application No. 60/257,909, filed Dec. 22, 2000.

INCORPORATION BY REFERENCE

The entireties of U.S. patent application Ser. Nos. 10/704, 177, filed Nov. 7, 2003, and U.S. patent application Ser. No. 10/028,030, filed Dec. 19, 2001, now U.S. Pat. No. 6,655, 763, and U.S. Provisional Application No. 60/257,909, filed Dec. 22, 2000, are hereby incorporated by reference herein and made a part of this specification.

BACKGROUND OF THE INVENTION

1. Field of the Invention

The present invention relates to slide assemblies and, more particularly, to quick disconnect-type slide assemblies.

2. Description of the Related Art

For convenience and to conserve floor space, computer servers for high-capacity computer systems are often mounted in rack structures. Typically, several computer servers are mounted in each rack structure. Each server is typically mounted on a pair of slide assemblies to allow the server to slide in and out of the rack structure for convenient access to the server.

Each slide assembly comprises two or more slide segments. In slide assemblies comprising only two slide segments, a first or outer slide segment is mounted to a frame of the rack structure, and a second or inner slide segment is mounted to the server. The outer slide segment defines a channel. The inner slide segment is movable in the channel to extend or retract the slide assembly. A bearing assembly is movably positioned in the channel to facilitate sliding movement of the inner slide segment with respect to the outer slide segment.

In quick disconnect slide assemblies, the inner slide segment can be entirely removed from the channel and detached from the outer slide segment. This allows convenient removal of the computer server from the server rack structure for repair or replacement of the computer server. The inner slide segment remains attached to the computer server when the server is removed from the rack.

To replace the computer server in the server rack, a rear end of the inner slide segment must be guided back into the channel of the outer slide segment. Because each server is typically supported by a pair of slide assemblies, the ends of the inner slide segments of both slide assemblies must be guided into the channels of the outer slide segments substantially in unison. This often proves difficult since the computer servers are typically heavy and awkward to handle.

If the inner slide segment is not properly aligned in the channel, the end of the inner slide segment can interfere with the bearing assembly. As the inner slide segment is moved rearwardly in the channel, the bearing assembly is moved with it. When the bearing assembly reaches the end of the channel, further rearward movement of the bearing assembly is prevented. This makes further rearward movement of the inner slide segment difficult. The inner slide segment, along with the attached computer server, may have to be moved forwardly and realigned in the channel before the slide assembly can be fully retracted. In addition to being inconvenient, damage to the bearing assembly or other components of the slide assembly can result if the inner slide segment is forcibly retracted.

In most quick disconnect-type slide assemblies, a lock is provided to prevent the unintentional detachment of the inner slide segment from the outer slide segment when the slide assembly is extended. However, while it is generally desirable for the lock to engage when the slide assembly is fully extended, it is generally undesirable and inconvenient for the lock to engage as the inner slide segment and attached computer server are first installed in the server rack.

SUMMARY OF THE INVENTION

A preferred embodiment is a slide assembly including a first slide segment having a forward end, a rearward end and defining a channel. A second slide segment is movable within the channel from a retracted position to an extended position relative to the first slide segment and is removable from the forward end of the first slide segment. A bearing assembly is configured to facilitate sliding movement of the second slide segment relative to the first slide segment. The bearing assembly is movable within the channel toward the forward end of the first slide segment along with movement of the second slide segment toward the extended position. The bearing retainer defines a first engagement surface and a latch defines a second engagement surface. When the second slide segment is removed from engagement with the bearing assembly, the first engagement surface is positioned adjacent the second engagement surface such that upon rearward movement of the bearing assembly the second engagement surface contacts the first engagement surface to inhibit further rearward movement until the latch is contacted and biased to a release position by a component of the slide assembly other than the bearing assembly.

A preferred embodiment is a slide assembly including a first slide segment having a forward end, a rearward end and defining a channel. A second slide segment is movable within the channel from a retracted position to an extended position relative to the first slide segment and is removable from the forward end of the first slide segment. A bearing assembly is configured to facilitate sliding movement of the second slide segment relative to the first slide segment. The bearing assembly is movable within the channel toward the forward end of the first slide segment along with movement of the second slide segment toward the extended position. The bearing retainer defines a first engagement surface and a latch defines a second engagement surface. When the second slide segment is removed from engagement with the bearing assembly, the latch is moved from a first position towards a second position and then moves back towards the first position wherein the first engagement surface is positioned adjacent the second engagement surface such that upon rearward movement of the bearing assembly the second engagement surface contacts the first engagement surface to inhibit further rearward movement. The first and second engagement surfaces are configured such that when a rearward force is applied to the bearing assembly, no force component is applied to the latch in a direction tending to move the latch towards the second position.

A preferred embodiment is a slide assembly including a first slide segment having a forward end, a rearward end and defining a channel. A second slide segment is movable within the channel from a retracted position to an extended position relative to the first slide segment and is removable from the forward end of the first slide segment. A bearing assembly is configured to facilitate sliding movement of the second slide segment relative to the first slide segment. The bearing assembly is movable within the channel toward the forward end of the first slide segment along with movement of the second slide segment toward the extended position and a latch is secured to the first slide segment. During removal of the second slide segment from the first slide segment, the bearing assembly moves into a locked position relative to the first slide segment wherein rearward movement of the bearing assembly relative to the first slide segment is blocked by the latch. The bearing assembly and the latch are configured such that the bearing assembly is not released from the locked position in response to a rearward force exerted on the bearing retainer. A component of the slide assembly other than the bearing retainer is configured to move the latch to release the bearing assembly from the locked position during reinsertion of the second slide segment into the first slide segment.

These and other aspects of the present invention will become readily apparent to those skilled in the art from the following detailed description of the preferred embodiments and the attached figures, the invention not being limited to any particular embodiment disclosed herein.

DETAILED DESCRIPTION OF THE PREFERRED EMBODIMENT

Figure 1:
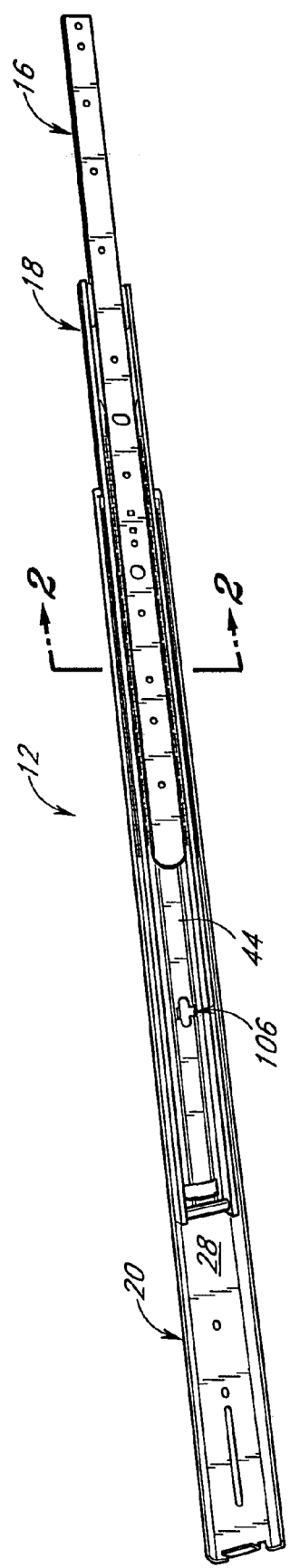
FIG. 1 is a perspective view of one embodiment of a slide assembly having certain features and advantages in accordance with the present invention.

A slide assembly having features in accordance with the present invention is illustrated in FIG. 1 and designated generally by the reference numeral 12. In the embodiment illustrated in FIG. 1, the slide assembly 12 includes a first or inner slide segment 16, a second or intermediate slide segment 18, and a third or outer slide segment 20. The inner slide segment 16 is adapted for mounting to an outer case or housing of a computer server (not shown). The outer slide segment 20 is adapted for mounting to a stationary server rack structure (not shown). Each computer server desirably is supported in the server rack structure by a pair of slide assemblies 12, one on either side of the computer server, to allow the computer server to slide in and out of the server rack structure.

Figure 2:
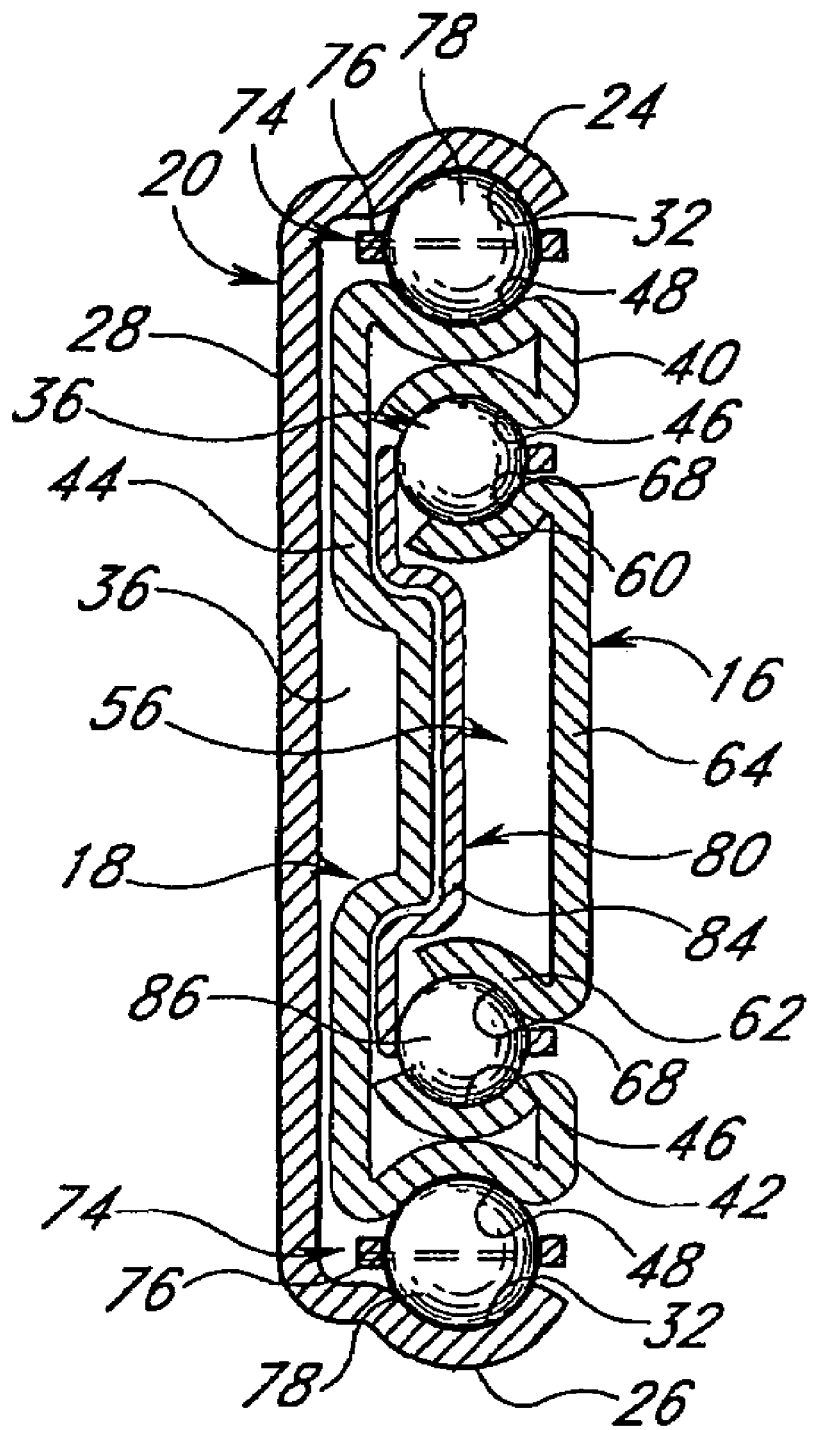
FIG. 2 is a cross-sectional view of the slide assembly of FIG. 1, taken along the line 2—2 of FIG. 1.

FIG. 2 is a cross-sectional view of the slide assembly 12 of FIG. 1, taken along the line 2—2 of FIG. 1. With reference to FIGS. 1 and 2, the outer slide segment 20 has a generally C-shaped cross-section and comprises an upper wall 24, a lower wall 26, and a planar side wall 28 extending between the upper and lower walls 24, 26. Each of the upper and lower walls 24, 26 defines an arcuate bearing surface 32. The bearing surfaces 32 generally face inward towards a central longitudinal axis of the slide assembly 12. A longitudinal channel 36 is defined by the bearing surfaces 32 and a planar inner surface of the side wall 28.

The intermediate slide segment 18 also has a generally C-shaped cross-section and comprises an upper wall 40, a lower wall 42, and a side wall 44 extending between the upper and lower walls 40, 42. Each of the upper and lower walls 40, 42 of the intermediate slide segment 18 defines an arcuate inner bearing surface 46 and an arcuate outer bearing surface 48. The inner bearing surfaces 46 face towards, and the outer bearing surfaces 48 face away from, the central longitudinal axis of the slide assembly 12. A longitudinal channel 56 is defined by the inner bearing surfaces 46 and an inner surface of the side wall 44.

Like the outer slide segment 20 and the intermediate slide segment 18, the inner slide segment 16 also has a generally C-shaped cross-section and comprises an upper wall 60, a lower wall 62, and a side wall 64 extending between the upper and lower walls 60, 62. Each of the upper and lower walls 60, 62 defines an arcuate bearing surface 68. The bearing surfaces 68 of the inner slide segment 16 face outward, or away from the central longitudinal axis of the slide assembly 12.

The intermediate slide segment 18 is positioned in the channel 36 of the outer slide segment 20 so that the bearing surfaces 32 of the outer slide segment 20 are located adjacent the outer bearing surfaces 48 of the intermediate slide segment 18. A bearing assembly 74 is positioned between each bearing surface 32 of the outer slide segment 20 and the adjacent outer bearing surface 48 of the intermediate slide segment 18. In the illustrated embodiment, each bearing assembly 74 comprises a thin, elongated, generally planar bearing spacer 76 and a number of spherical ball bearings 78. The ball bearings 78 are retained by the bearing spacer 76 in spaced-apart openings formed along the length of the bearing spacer 76. The ball bearings 78 roll against the bearing surfaces 32, 48 to facilitate longitudinal sliding movement of the intermediate slide segment 18 with respect to the outer slide segment 20. As will be appreciated, the bearings 78 are retained in the openings of the spacer 76 by the bearing surfaces 32, 48.

Referring still to FIGS. 1 and 2, the inner slide segment 16 is positioned in the channel 56 of the intermediate slide segment 18 so that the bearing surfaces 68 of the inner slide segment 16 are located adjacent the inner bearing surfaces 46 of the intermediate slide segment 18. A bearing assembly 80 is positioned in the channel 56 between the inner slide segment 16 and the intermediate slide segment 18 to facilitate longitudinal sliding movement of the inner slide segment 16 with respect to the intermediate slide segment 18. In the illustrated embodiment, the bearing assembly 80 comprises a bearing retainer 84 and a number of spherical ball bearings 86.

The bearing surfaces 32 of the outer slide segment 20, the inner and outer bearing surfaces 46, 48 of the intermediate slide segment 18, and the bearing surfaces 68 of the inner slide segment 16 desirably are concave. This prevents lateral separation of the intermediate slide segment 18 from the outer slide segment 20, and of the inner slide segment 16 from the intermediate slide segment 18.

Figure 3:
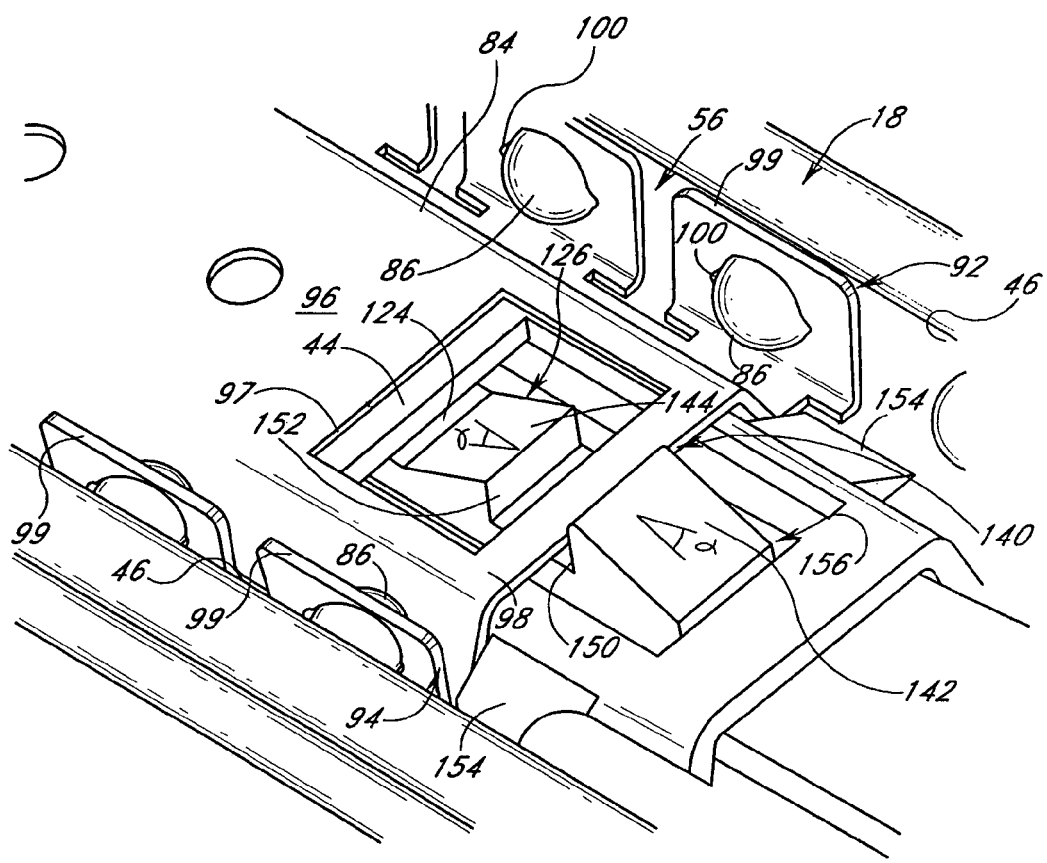
FIG. 3 is a perspective view of a portion of the intermediate slide segment of the slide assembly of FIG. 1, with the latch illustrated in a first position.

FIG. 3 is a perspective view of a portion of the intermediate slide segment 18 with the bearing assembly 80 positioned in the channel 56. In the illustrated embodiment, the bearing retainer 84 comprises an upper retainer portion 92, a lower retainer portion 94, and a side portion 96 interconnecting the upper and lower retainer portions 92, 94. An opening 97 is provided in the side portion 96. A crossmember 98 extends between the upper and lower retainer portions 92, 94. The bearing retainer 84 is seated in the channel 56 so that the upper and lower retainer portions 92, 94 are located adjacent the inner bearing surfaces 46, and the side portion 96 is located adjacent the inner surface of the side wall 44.

In the embodiment illustrated in FIG. 3, each of the upper and lower retainer portions 92, 94 comprises a number of tabs 99. The tabs 99 extend generally perpendicularly to the side portion 96 of the bearing retainer 84. Each tab 99 has a circular opening 100 provided therein to accommodate one of the ball bearings 86. The diameter of the openings 100 is preferably slightly less than the diameter of the ball bearings 86 to trap the ball bearings 86 between the tabs 99 and the inner bearing surfaces 46 of the intermediate slide segment 18.

The bearing assembly 80 desirably is movable along the length of the channel 56 of the intermediate slide segment 18. This allows the ball bearings 86 to roll along the inner bearing surfaces 46 of the intermediate slide segment 18 as the inner slide segment 16 is moved in and out of the channel 56. A rear stop 106 (see FIG. 1) is provided in a rear portion of the intermediate slide segment 18 to limit rearward movement of the bearing assembly 80. In the illustrated embodiment, the rear stop 106 comprises a laterally raised portion of the inner surface of the side wall 44 of the intermediate slide segment 18.

Figure 4:
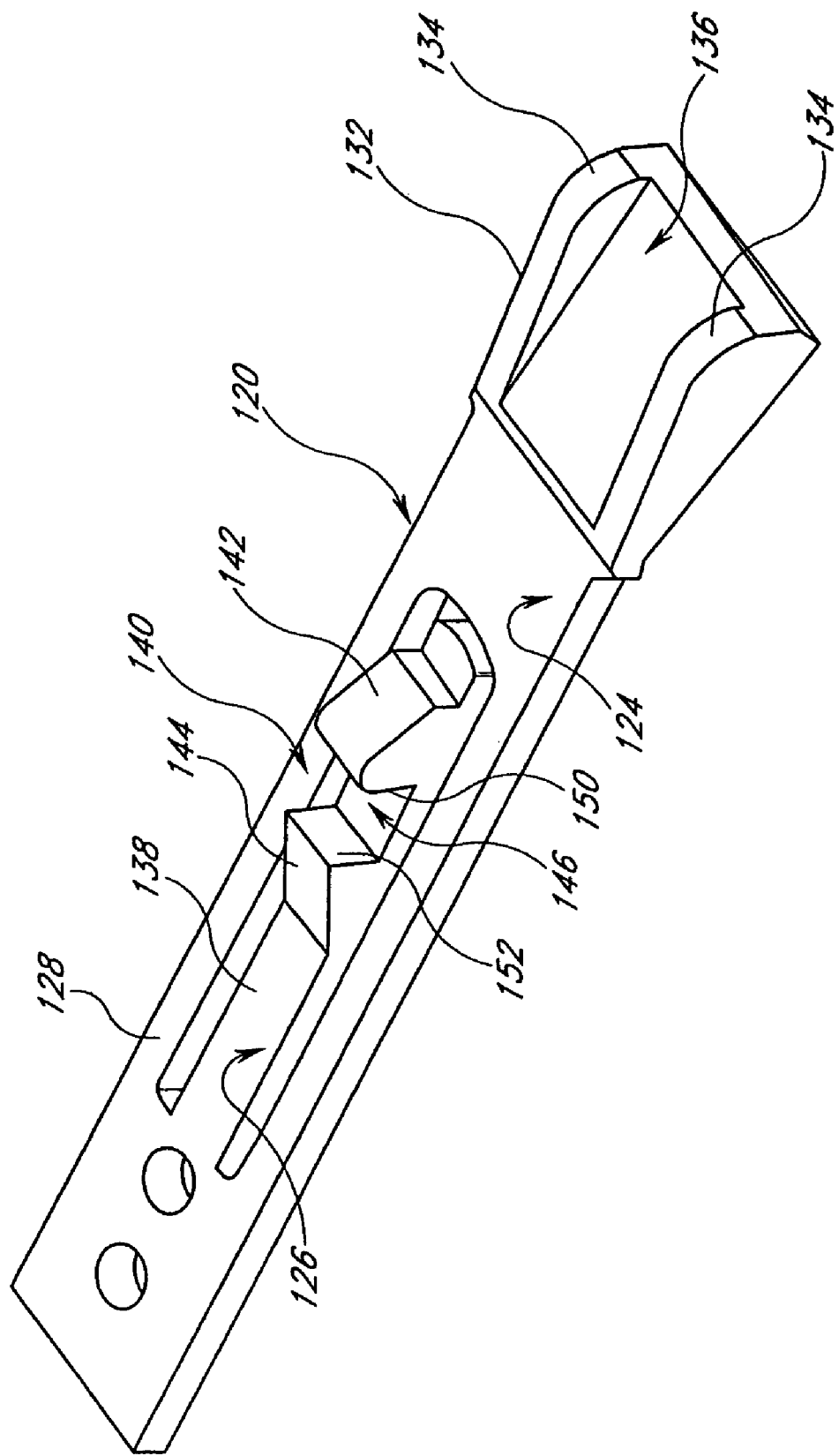
FIG. 4 is a perspective view of the controller of the slide assembly of FIG. 1.

With reference now to FIG. 4, a controller 120 for the slide assembly 12 is shown. In the illustrated embodiment, the controller 120 includes both an actuator 124 and a latch 126. The actuator 124 comprises a thin, planar, cantilevered primary arm 128 having an end portion 132 of increased thickness. The thickness of the end portion 132 is greatest near a front end of the controller 120. The end portion 132 desirably has rounded corners 134 and a groove 136 formed in the center thereof.

The latch 126 comprises a thin, planar, cantilevered secondary arm 138 having a raised locking portion 140 at a front end thereof. The locking portion 140 includes a generally planar sloping front face 142 and a generally planar sloping rear face 144. Desirably, the front face 142 extends a slightly greater distance above the planar surface of the secondary arm 138 than does the rear face 144. In the illustrated embodiment, a recess 146 is formed between the front face 142 and the rear face 144. The recess 146 is defined by a front locking surface 150 and a rear locking surface 152. Alternatively, the function of the front locking surface 150, which will be described below, can be performed by a pair of raised hard stops 154 (see FIG. 3) provided at the forward end of the channel 56.

The controller 120 desirably is formed of a stiff yet flexible material to allow the primary and secondary arms 128, 138 to flex or bend, and resiliently return to position. Preferably, the controller 120 is formed of a resilient, durable, low-friction plastic material, such as acetal.

Figure 5:
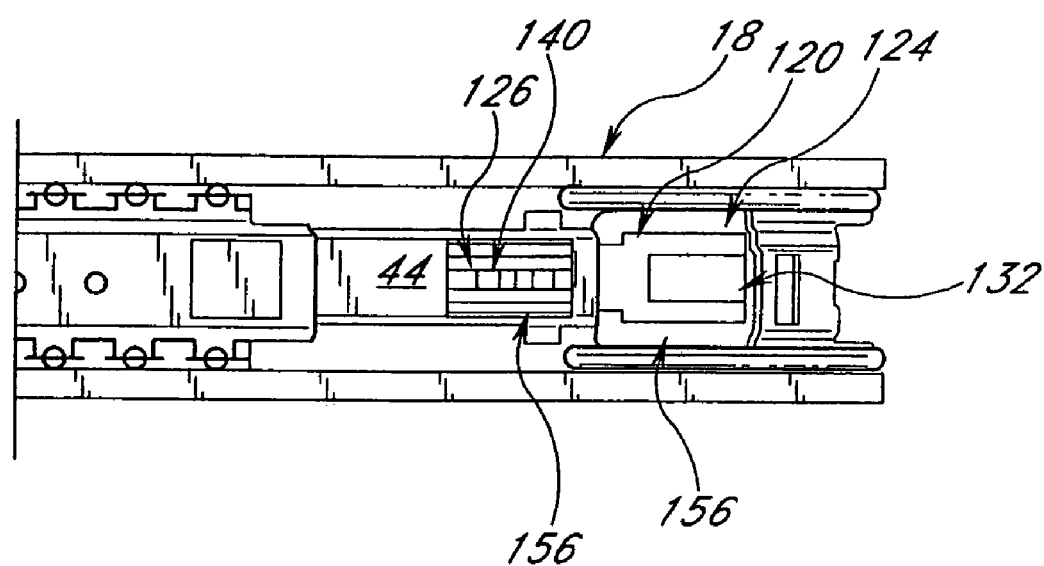
FIG. 5 is an elevational view of the forward end of the intermediate slide segment of the slide assembly of FIG. 1.
Figure 6:
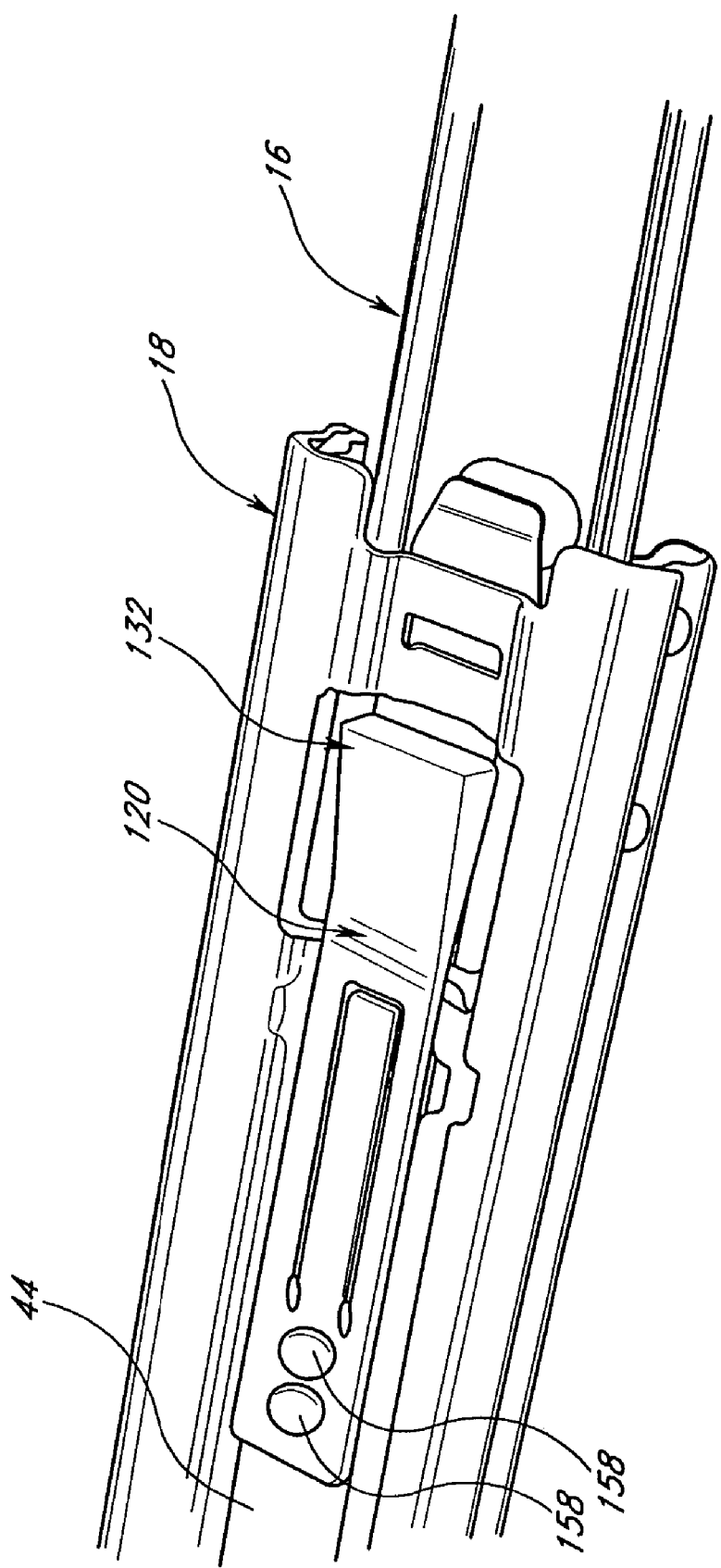
FIG. 6 is a perspective view of a portion of the inner slide segment and a portion of the intermediate slide segment of the slide assembly of FIG. 1, showing the attachment of the controller to the intermediate slide segment.

The forward end of the intermediate slide segment 18 is shown in FIG. 5. As illustrated, a pair of openings 156 are provided in the side wall 44 of the intermediate slide segment 18 near the forward end thereof. The controller 120 is positioned behind the side wall 44 so that the end portion 132 of the actuator 124 and the locking portion 140 of the latch 126 are in registration with the openings 156. The controller 120 is attached to an outer surface of the side wall 44 by suitable means, such as a pair of rivets 158 (see FIG. 6) that extend through openings formed in a side of the controller 120 opposite the end portion 132.

Referring again to FIG. 3, the latch 126 is illustrated in a first position, wherein the planar surface of the secondary arm 124 rests against the outer surface of the side wall 44 of the intermediate slide segment 18. The locking portion 140 of the latch 126 extends through one of the openings 156 in the side wall 44 and into the channel 56 of the intermediate slide segment 18.

To ensure proper operation of the latch 126, the front face 142 desirably forms an angle $\alpha$ with the plane of the side wall 44 of between 10 and 80 degrees when the latch 126 is in the first position illustrated in FIG. 3. More desirably, the angle α is between 30 and 45 degrees. Preferably, the angle α is 38 degrees. The rear face 144 likewise desirably forms an angle γ with the plane of the side wall 44 of between 10 and 80 degrees when the latch 126 is in the first position illustrated in FIG. 3. More desirably, the angle is γ is between 15 and 30 degrees. Preferably, the angle γ is 25 degrees. The front and rear locking surfaces 150, 152 preferably are disposed generally perpendicularly to the side wall 44 when the latch is in the first position.

With reference to FIGS. 1 and 3, the slide assembly 12 of the illustrated embodiment is of the quick disconnect variety. Thus, the inner slide segment 16 can be entirely removed from the channel 56 of the intermediate slide segment 18 to allow convenient removal of the computer server from the server rack for repair or replacement of the computer server. To replace the computer server in the server rack, the rear end of the inner slide segment 16 must be guided back into the channel 56 of the intermediate slide segment 18.

The distance between the inner bearing surfaces 46 of the intermediate slide segment 18 is necessarily greater than the height of the of the inner slide segment 16 in order to accommodate the ball bearings 86. As a result, the inner slide segment 16 can become misaligned in the channel 56. When the inner slide segment 16 is misaligned, the end of the inner slide segment 16 can interfere with the bearing assembly 80.

Because the ball bearings 86 roll along the bearing surfaces 68 of the inner slide segment 16 and the inner bearing surfaces 46 of the intermediate slide segment 18, the bearing assembly 80 follows the inner slide segment 16 as the inner slide segment 16 is moved rearwardly in the channel 56. When the bearing assembly 80 abuts the rear stop 106, further rearward movement of the bearing assembly 80 is prevented. As a result, the ball bearings 86 are prevented from rolling along the inner bearing surfaces 46 of the intermediate slide segment 18. This makes further rearward movement of the inner slide segment 16 difficult. In addition to being inconvenient, damage to the bearing assembly 80 or other components of the slide assembly 12 can result if the inner slide segment 16 is forcibly retracted.

The latch 126 serves to retain the bearing assembly 80 near the forward end of the channel 56. When the latch 126 is in the first position illustrated in FIG. 3, the locking portion 140 extends into the channel 56 beyond the side portion 96 of the bearing retainer 84. The cross-member 98 is captured between the front locking surface 150 and the rear locking surface 152. Rearward movement of the bearing assembly 80 is limited by the rear locking surface 152. Forward movement of the bearing assembly 80 is limited by the front locking surface 150 and/or the hard stops 154. With the bearing assembly 80 retained near the front of the channel 56, it is easier to guide the forward end of the inner slide segment 16 past the forward end of the bearing assembly 80 as the inner slide segment is inserted into the channel 56.

Figure 7:
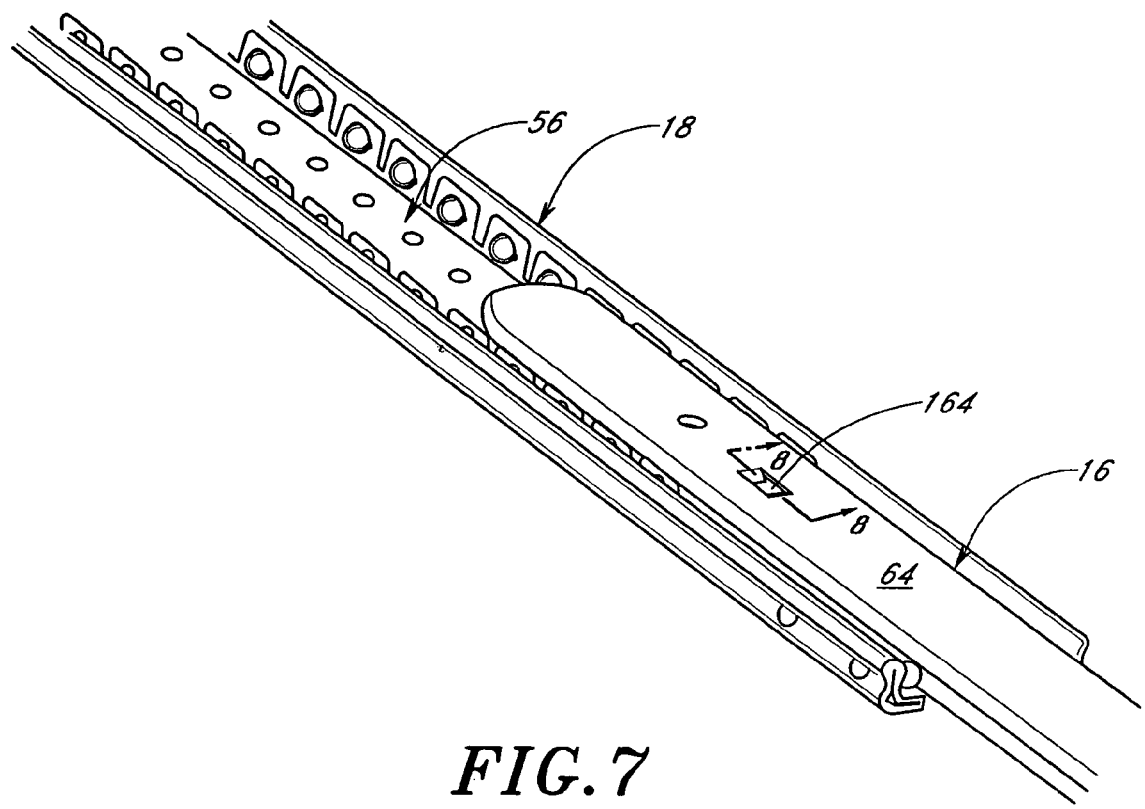
FIG. 7 is a perspective view of a portion of the inner slide segment and a portion of the intermediate slide segment of the slide assembly of FIG. 1, showing the tab on the inner slide segment.
Figure 8:
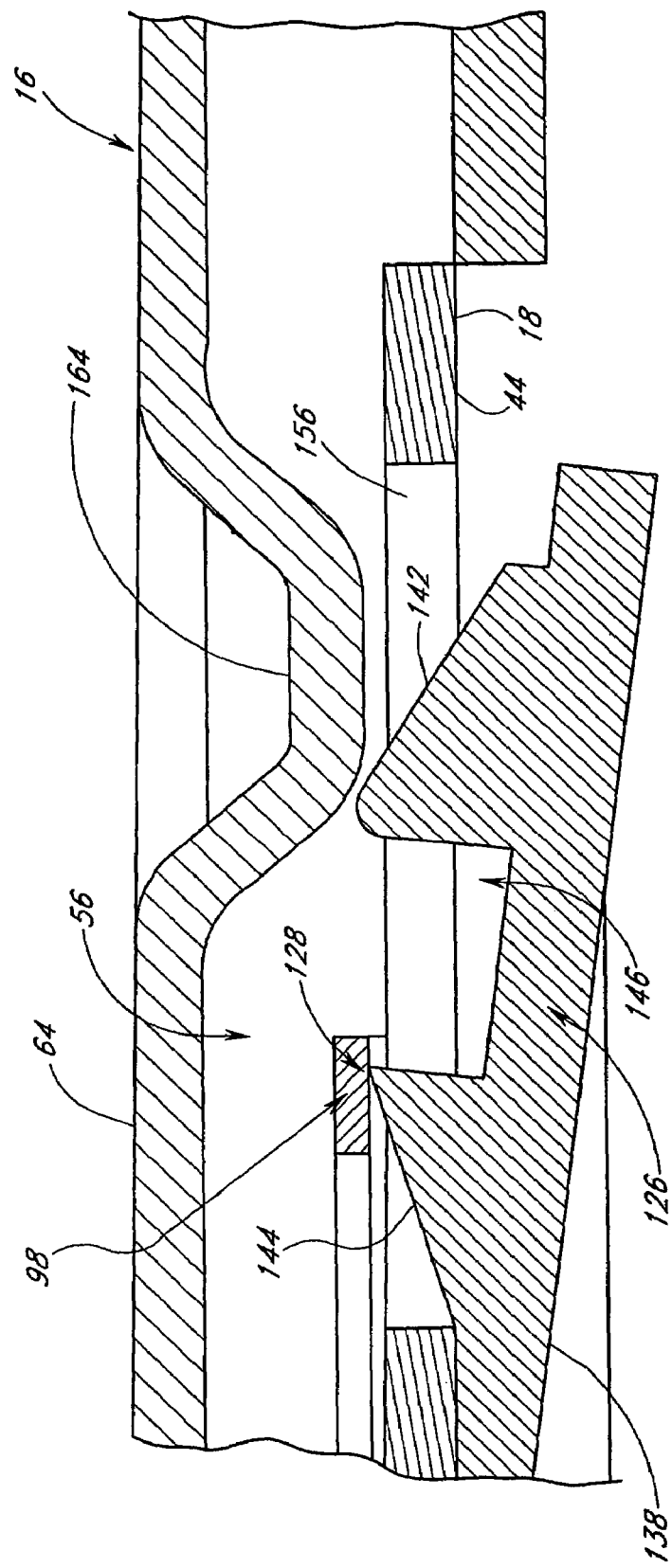
FIG. 8 is a cross-sectional view of a portion of the inner slide segment and a portion of the intermediate slide segment of the slide assembly of FIG. 1, taken along the line 8—8 of FIG. 7.
Figure 9:
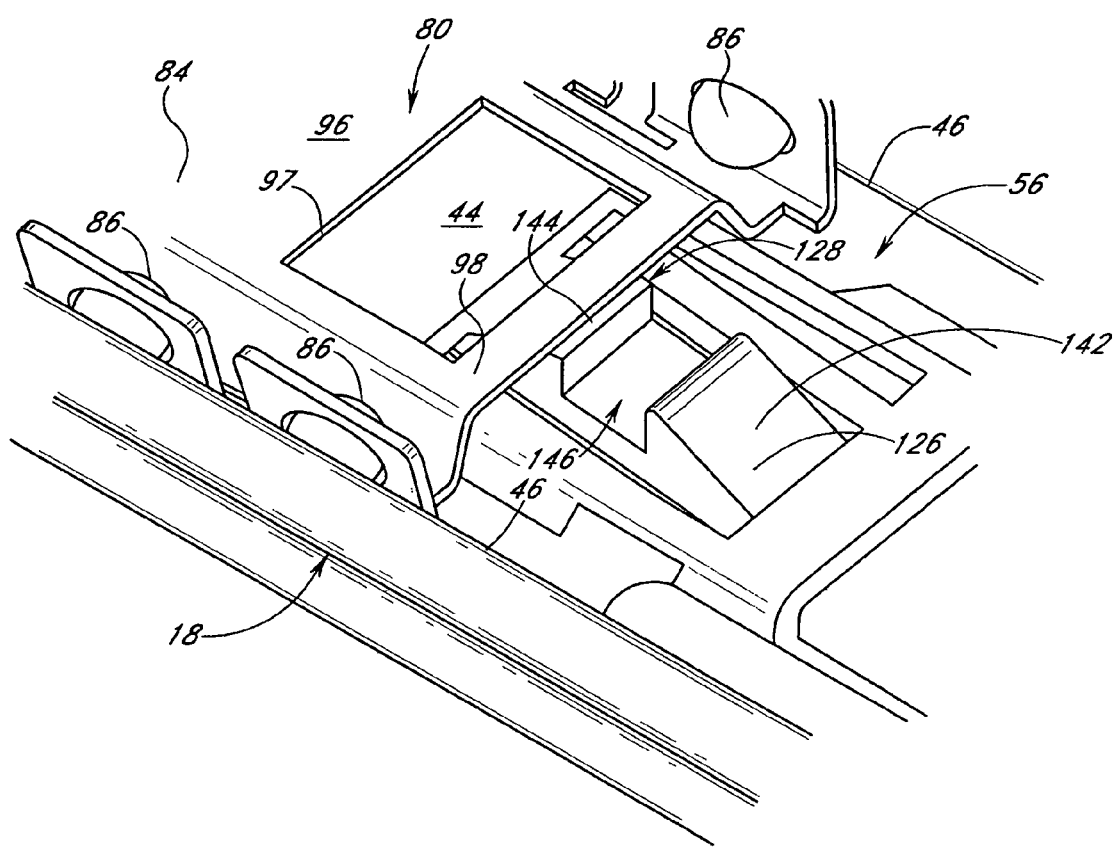
FIG. 9 is a perspective view of a portion of the intermediate slide assembly of the slide assembly of FIG. 1, with the latch shown in a second position.

Referring now to FIG. 7, a tab 164 is provided on the side wall 64 of the inner slide segment 16. In the illustrated embodiment, the tab 164 comprises an indentation on the side wall 64 that extends into the channel 56 of the intermediate slide segment 18. When the inner slide segment 16 is inserted and moved rearwardly in the channel 56, the tab 164 contacts the front face 142 of the latch 126, as illustrated in FIG. 8. This causes the secondary arm 138 to flex away from the side wall 44 of the intermediate slide segment 18. In this second latch position, illustrated in FIGS. 8 and 9, the locking portion 140 does not extend into the opening 97 in the side portion 96 of the bearing retainer 84. The bearing assembly 80 is therefore free to move in the channel 56 with the inner slide segment 16.

As the inner slide segment 16 is moved forwardly in the channel 56, the bearing assembly 80 is moved towards the latch 126. When the inner slide segment 16 is removed from the channel 56, the cross-member 98 of the bearing retainer 84 contacts the rear face 144 of the latch 126, causing the latch 126 to move to the second latch position, wherein the secondary arm 138 is flexed away from the side wall 44 of the intermediate slide segment 18. The cross-member 98 rides over the rear face 144 of the latch 126 and into the recess 146 to lock the bearing assembly 80 in place again.

One advantage of the slide assembly 12 of the present embodiment is that it does not require a separate manual operation to lock or unlock the bearing assembly 80. As the inner slide segment 16 is inserted in the channel, the tab 164 contacts the locking portion 140 of the latch 126 to automatically free the bearing assembly 80. When the inner slide segment 16 is removed from the channel 56, the bearing assembly 80 is drawn forwardly towards the latch 126. The cross-member 98 of the bearing retainer 84 contacts the locking portion 140 of the latch 126 and the bearing assembly 80 is automatically locked in place.

Figure 10:
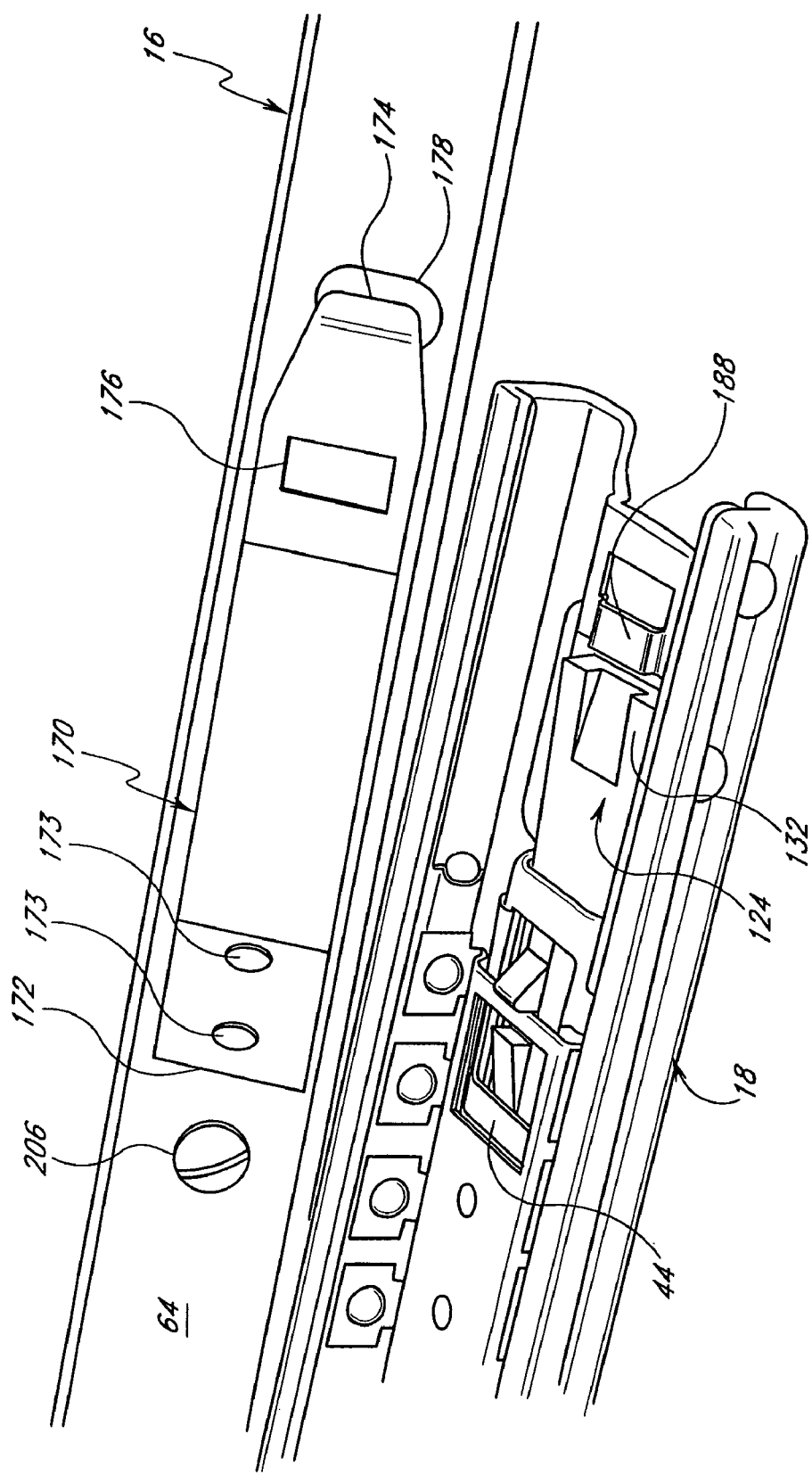
FIG. 10 is a perspective view of a portion of the inner slide segment and a portion of the intermediate slide segment of the slide assembly of FIG. 1, with the inner slide segment detached from the intermediate slide segment.

With reference now to FIG. 10, a lock arm 170 is provided on an inner surface of the side wall 64 of the inner slide segment 16. In the illustrated embodiment, the lock arm 170 comprises a thin, planar steel strip that is attached at a first end 172 to the inner surface of the side wall 64. The first end 172 of the lock arm 170 preferably is attached to the side wall 64 by a pair of tabs (not shown) that extend from the side wall 64 through a pair of openings 173 in the lock arm 172. The lock arm 170 is bent slightly away from the side wall 64 and extends forwardly and outwardly from the side wall 64 from the first end 172. A second end 174 of the lock arm 170 is bent inwardly towards the side wall 64. An opening 176 is provided in the lock arm near the second end 174.

The lock arm 170 desirably can be flexed inwardly towards the side wall 64 of the inner slide segment 16, and then resiliently returns to its original position. An opening 178 is provided in the side wall 64 of the inner slide segment 16 adjacent the second end 174 of the lock arm 170. When the lock arm 170 is fully flexed towards the side wall 64, the second end 174 of the lock arm 170 extends into the opening 178.

Referring still to FIG. 10, the intermediate slide segment 18 includes an engagement surface 188. In the illustrated embodiment, the engagement surface 188 comprises a bridge-like structure located immediately forward of the end portion 132 of the actuator 124. The engagement surface 188 desirably is slightly raised relative to the side wall 44 of the intermediate slide segment 18.

Figure 11:
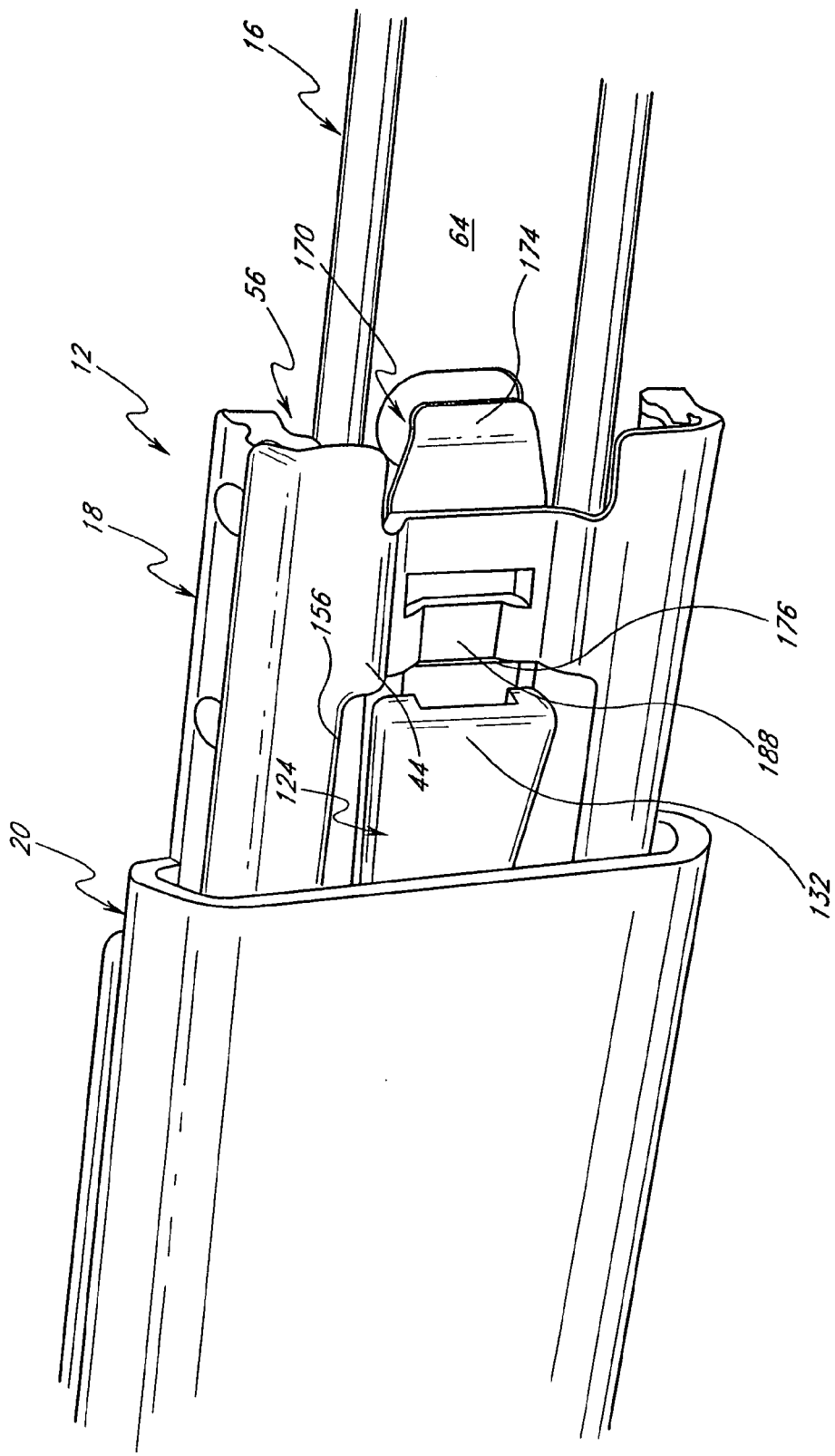
FIG. 11 is a perspective view of a portion of the inner slide segment and the forward ends of the intermediate slide segment and outer slide segment of the slide assembly of FIG. 1, with the lock arm of the inner slide segment engaging the engagement surface of the intermediate slide segment.

With reference now to FIGS. 10 and 11, the shape of the opening 176 in the lock arm 170 generally corresponds to the shape of the engagement surface 188. The lock arm 170 is biased towards the side wall 44 of the intermediate slide segment 18 so that, when the inner slide segment 16 is fully extended with respect to the intermediate slide segment 18, as illustrated in FIG. 11, the engagement surface 188 is caught in the opening 176 of the lock arm 170. As a result, further movement of the inner slide segment 16 with respect to the intermediate slide segment 18 is prevented.

To remove the inner slide segment 16 from the channel 56 of the intermediate slide segment 18, the second end 174 of the lock arm 170 must be moved towards the side wall 64 of the inner slide segment 16, preferably by manually pressing the actuator 124 towards the lock arm 170. This prevents the inner slide segment 16, and the attached computer server, from unintentionally being detached from the rest of the slide assembly 12 and possibly causing damage to the server. By moving the second end 174 of the lock arm 170 towards the side wall 64, the lock arm 170 is released from the engagement surface 188, and the inner slide segment 16 can then be removed from the channel 56.

Figure 12:
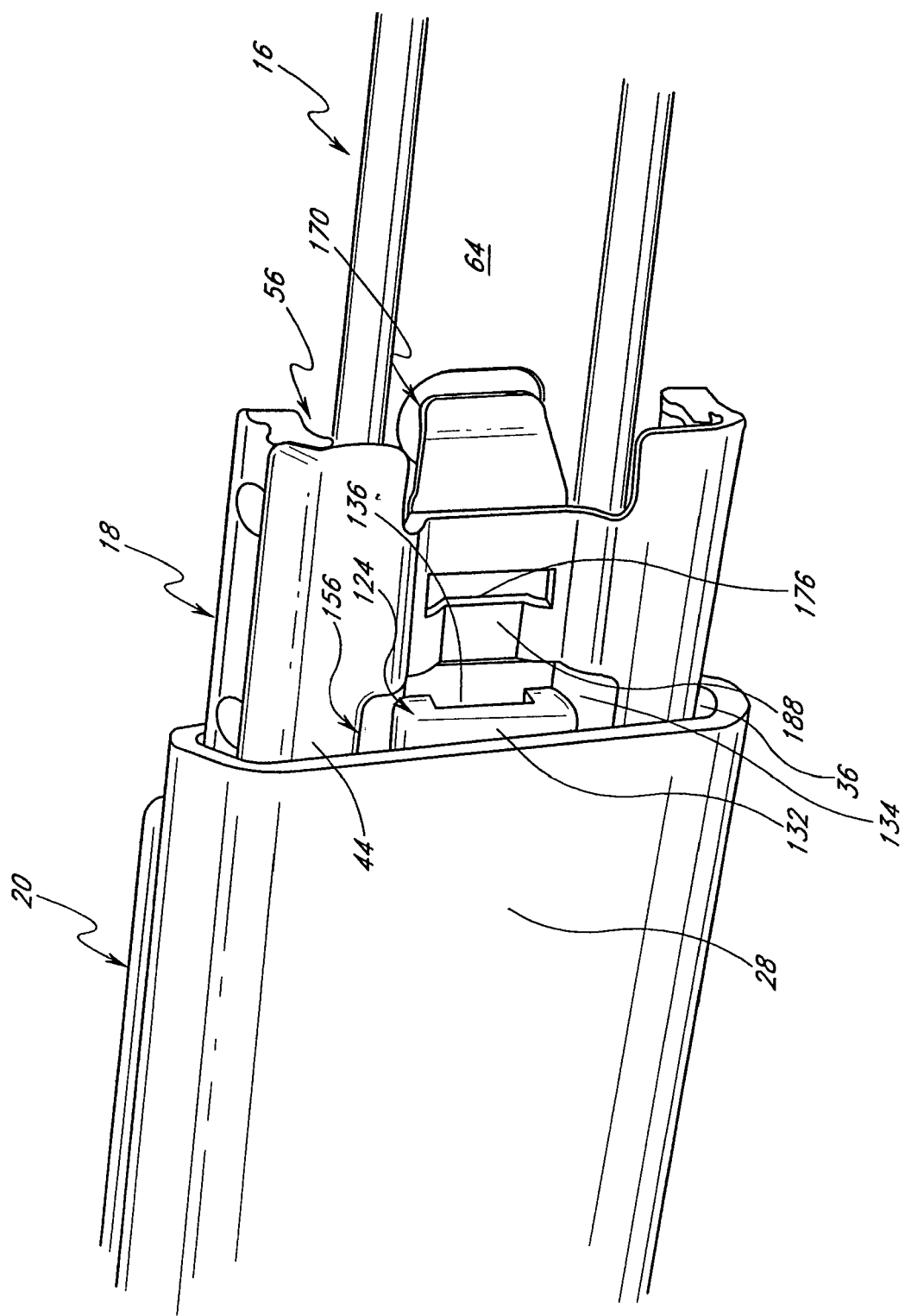
FIG. 12 is a perspective view of a portion of the inner slide segment and the forward ends of the intermediate slide segment and outer slide segment of the slide assembly of FIG. 1, with the lock arm of the inner slide segment disengaged from the engagement surface of the intermediate slide segment.

The actuator 124 serves to automatically release the lock arm 170 from the engagement surface 188 when the slide assembly 12 is retracted. As illustrated in FIG. 11, when the intermediate slide segment 18 is extended slightly with respect to the outer slide segment 20, the lock arm 170 is allowed to engage the engagement surface 188. However, when the intermediate slide segment 18 is retracted into the channel 36 of the outer slide segment 20, as illustrated in FIG. 12, the side wall 28 of the outer slide segment 20 contacts the end portion 132 of the actuator 124. The end portion 132 of the actuator 124, in turn, extends through the opening 156 in the side wall 44 of the intermediate slide segment 18 to press the lock arm 170 towards the side wall 64 of the inner slide segment 16. This releases the lock arm 170 from the engagement surface 188 and allows the inner slide segment 16 to be retracted into the channel 56 of the intermediate slide segment 18.

Because the end portion 132 of the actuator 124 is wider than the opening 176 in the lock arm 170, the end portion 132 is not caught in the opening 176 as the inner slide segment 16 is retracted. The groove 136 formed in the center of the end portion 132 allows for the passage of any fasteners 206 (see FIG. 10) that may extend through the side wall 64 of the inner slide segment to attach to the computer server to the inner slide segment 16. This prevents the fasteners 196 from interfering with the end portion 132 of the actuator as the inner slide segment 16 is moved relative in and out of the channel 56.

Figure 13:
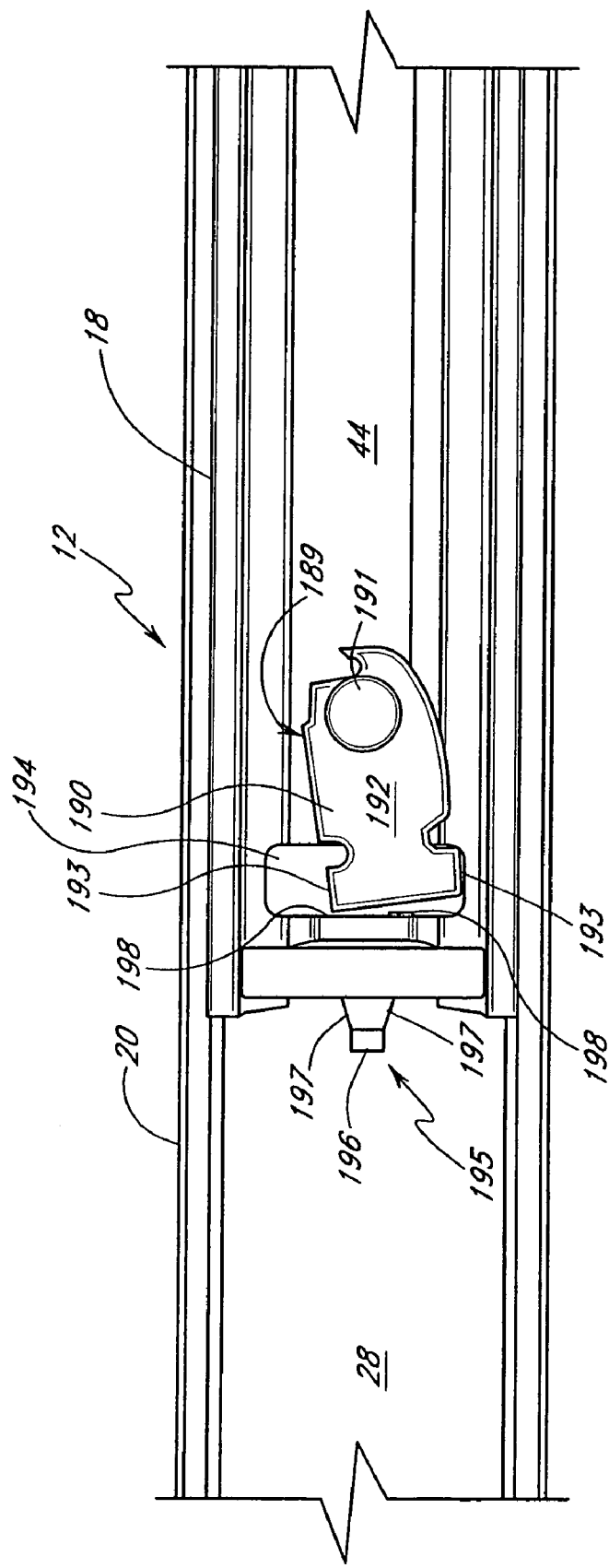
FIG. 13 is a perspective view of a portion of the outer slide segment and the rear end of the intermediate slide segment of the slide assembly of FIG. 1, with the pivot arm of the intermediate slide segment in abutting engagement with the stop surface of the stop member of the outer slide segment.

With reference to FIG. 13, the slide assembly 12 desirably also includes a lock 189 for locking the intermediate slide segment 18 in an extended position with respect to the outer slide segment 20. In the illustrated embodiment, the lock 189 comprises a pivot arm 190 that is pivotally attached by a rivet 191 or other suitable means to the side wall 44 of the intermediate slide segment 18. The pivot arm 190 comprises a generally planar main portion 192 and a pair of fingers 193 that extend towards the side wall 28 of the outer slide segment 20 through an opening 194 provided in the side wall 44 of the intermediate slide segment 18.

Figure 14:
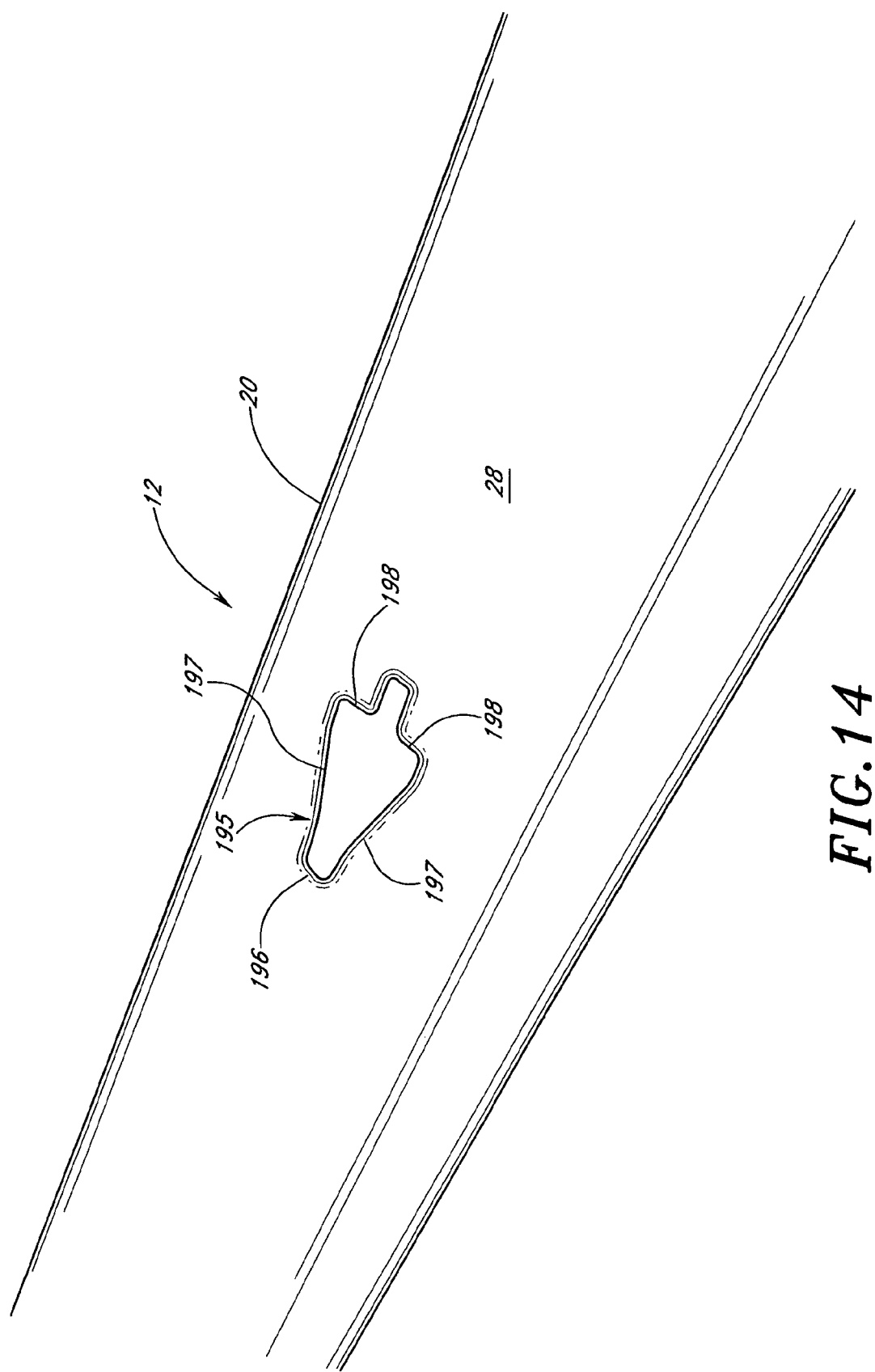
FIG. 14 is a perspective view of a portion of the back side of the outer slide segment of the slide assembly of FIG. 1 illustrating the stop member.

With reference to FIGS. 13 and 14, a stop member 195 desirably protrudes from the side wall 28 of the outer slide segment 20 towards the intermediate slide segment 18. In the illustrated embodiment, the stop member 195 is generally arrow-shaped, having a tip 196, a pair of diverging sides 197, and a pair of stop surfaces 198 that extend generally perpendicularly to a longitudinal axis of the slide assembly 12.

When the intermediate slide segment 18 is retracted with respect to the outer slide segment 20, and the inner slide segment 16 is extended or removed from the channel 56 of the intermediate slide segment 18, the pivot arm 190 is caused by gravity to reside near a bottom surface of the side wall 44. As the intermediate slide segment 18 is extended with respect to the outer slide segment 20, the pivot arm 190 meets the stop member 195 protruding from the side wall 28 of the outer slide segment 20. The upper finger 193 of the pivot arm 190 rides over the upwardly sloping side 197 of the stop member 195, then drops into abutting engagement with the upper stop surface 198. This prevents retraction of the intermediate slide segment 18 with respect to the outer slide segment 20.

Figure 15:
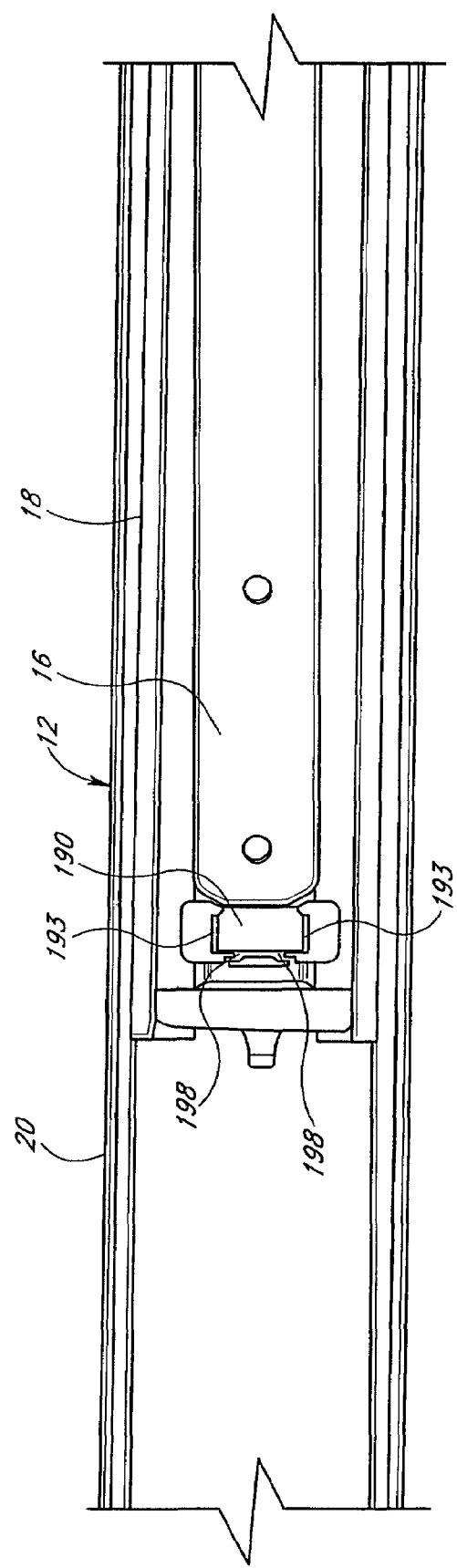
FIG. 15 is a perspective view of a portion of the outer slide segment and the rear ends of the inner and intermediate slide segments of the slide assembly of FIG. 1, with the pivot arm disengaged from the stop surface of the stop member.

To release the pivot arm 190, the inner slide segment 16 is retracted with respect to the intermediate slide segment 18, as illustrated in FIG. 15. As the inner slide segment 16 is retracted, the rear end of the inner slide segment 16 slides over the pivot arm 190 and lifts the pivot arm 190 so that the upper finger 193 is raised above the upper stop surface 198. This releases the pivot arm 190 and allows the intermediate slide segment 18 to be retracted with respect to the outer slide segment 20.

As discussed above, in quick disconnect slide assemblies, the inner slide segment is removable from the rest of the slide assembly to allow the attached computer server to be repaired or replaced. When the inner slide segment is first installed or reinstalled in the server rack, it is inconvenient to have to actuate a lock in order to retract the inner slide segment. Accordingly, in the present embodiment, to install the computer server in the server rack, the intermediate slide segment 18 is first fully retracted into the outer slide segment 20. The inner slide segment 16 is then inserted into the channel 56 of the intermediate slide segment 18 and retracted. Because the intermediate slide segment 18 is retracted with respect to the outer slide segment 20, the side wall 28 of the outer slide segment 20 pushes the end portion 132 of the actuator 124 through the opening 156 in side wall 44 of the intermediate slide segment 18. As the inner slide segment 16 is retracted, the end portion 132 of the actuator 124 contacts the lock arm 170 to prevent the lock arm from engaging the engagement surface 188 of the intermediate slide segment 18. Thus, the inner slide segment 16 and attached computer server can be installed and fully retracted in a single motion, without having to manually actuate the lock arm 170 of the inner slide segment 16.

Figure 16:
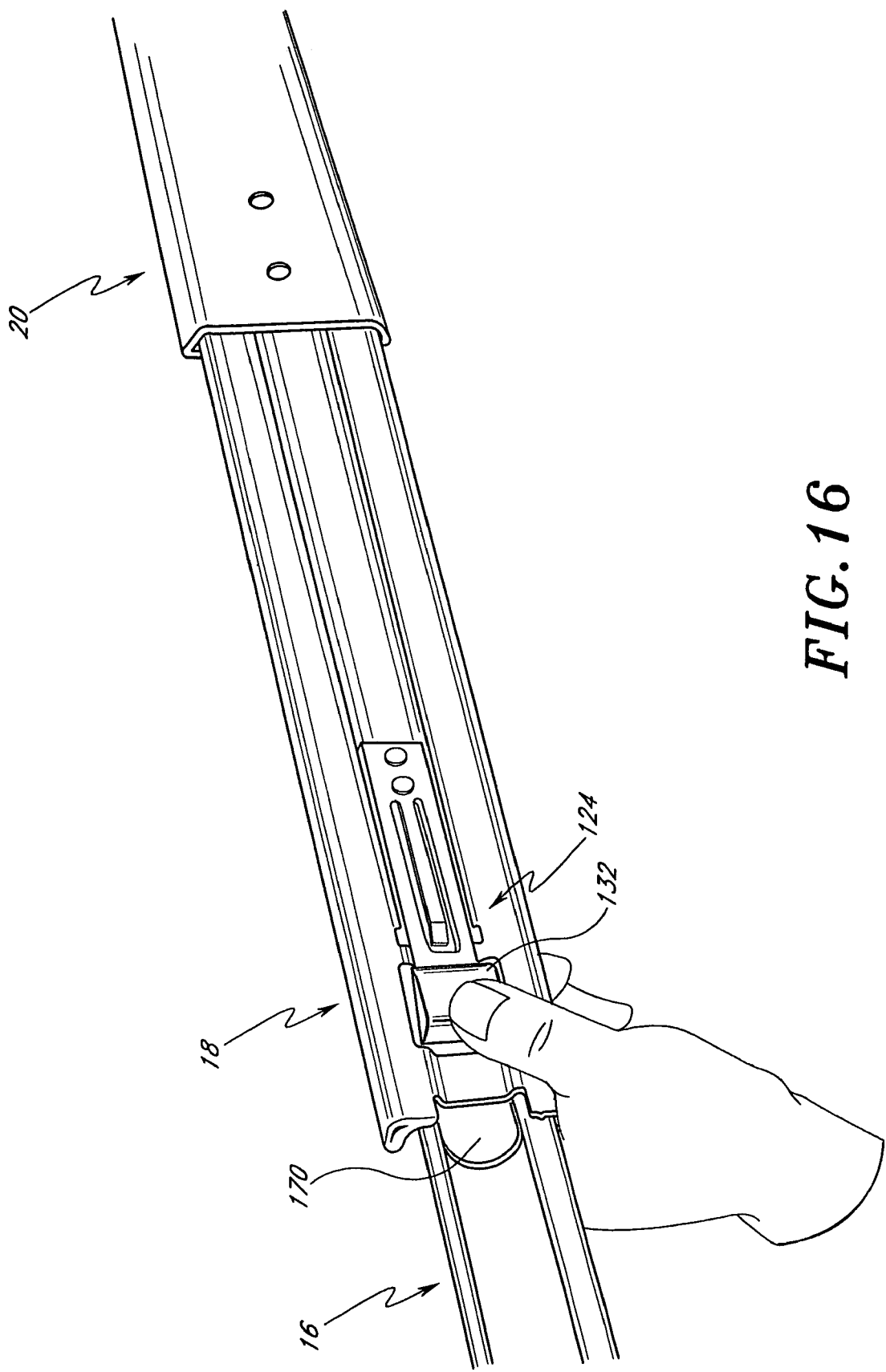
FIG. 16 is a perspective view of a portion of the back side of the slide assembly of FIG. 1, illustrating the manual actuation of the actuator.
Figure 17:
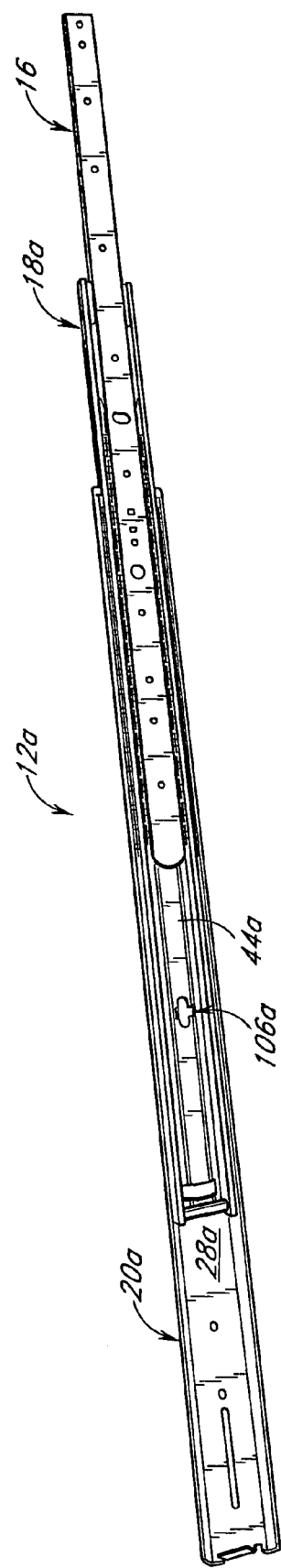
FIG. 17 is a perspective view of an alternative embodiment of the slide assembly.

Once installed, the slide assembly 12 can be extended to access the computer server. When the slide assembly 12 is fully extended, the inner slide segment 16 is locked with respect to the intermediate slide segment 18, and the intermediate slide segment 18 is locked with respect to the outer slide segment 20. To retract the slide assembly 12 again, the end portion 132 of the actuator 124 is manually pressed, as illustrated in FIG. 16, to release the lock arm 170 from the engagement surface 188 and thereby allow the inner slide segment 16 to be retracted into the intermediate slide segment 18. Because the lock arm 170 can be released by pressing the actuator 124 instead of the lock arm 170 itself, there is little risk that the fingers of the operator will get pinched between the lock arm 170 and the intermediate slide segment 18 as the lock arm 170 is disengaged and the inner slide segment 16 is retracted. When the inner slide segment 16 is retracted, the forward end of the inner slide segment 16 actuates the lock 189 of the intermediate slide segment 18 to allow the intermediate slide segment 18 to be retracted with respect to the outer slide segment 20.

Figure 18:
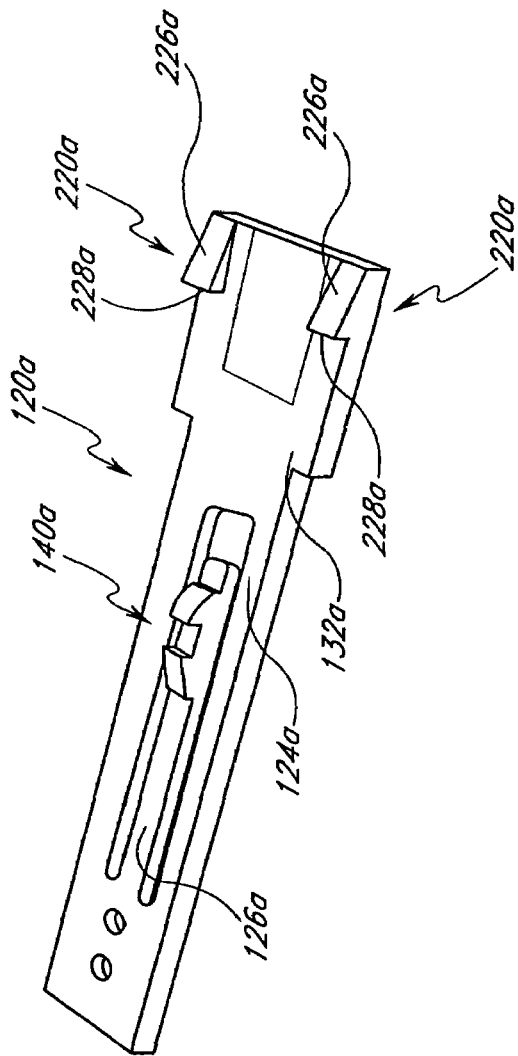
FIG. 18 is a perspective view of the front side of the controller of the slide assembly of FIG. 17.
Figure 19:
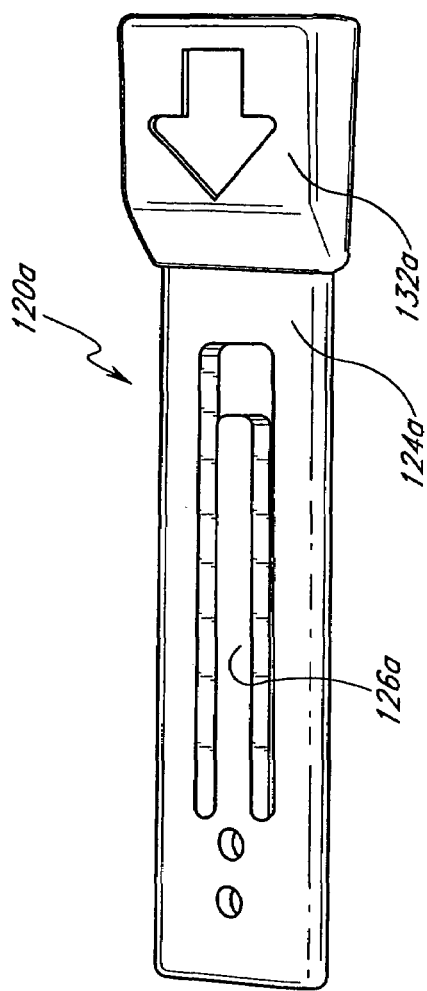
FIG. 19 is a perspective view of the back side of the controller of the slide assembly of FIG. 17.
Figure 20:
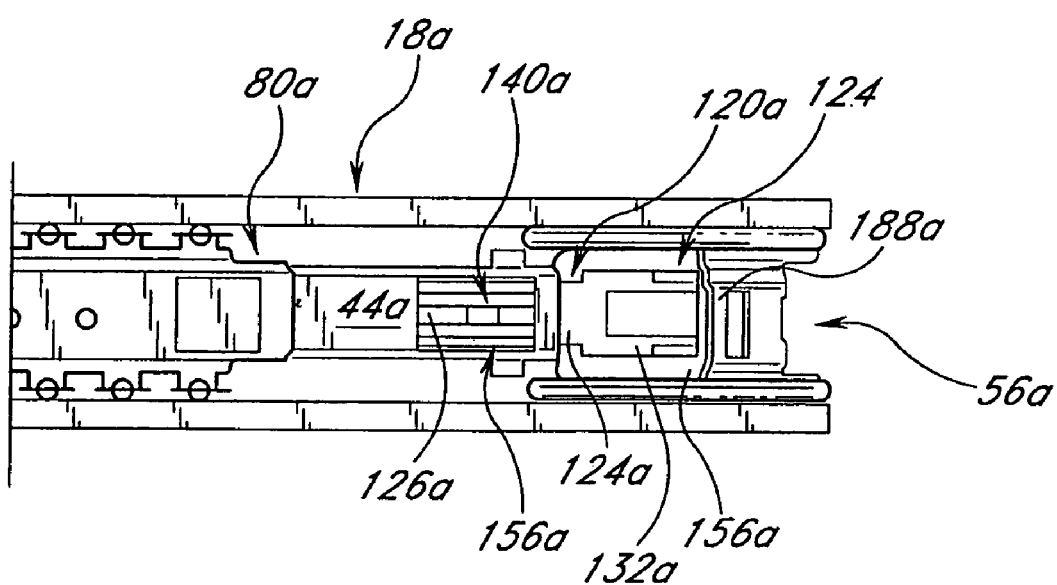
FIG. 20 is an elevational view of a forward end of the intermediate slide segment of the slide assembly of FIG. 17.

With reference now to FIGS. 17–21, an alternative embodiment of the slide assembly is illustrated. The controller 120a of the alternative embodiment is illustrated in FIGS. 18 and 19. As can be seen from FIGS. 18 and 19, the controller 120a is similar to the controller 120 of the previous embodiment, but includes a pair of catches 220a that extend from the end portion 132a of the actuator 124a. Each of the catches 220a preferably has a generally planar sloping front surface 226a and a generally planar catch surface 228a. Like the controller 120 of the previous embodiment, the controller 120a is attached to the side wall 44a of the intermediate slide segment 18a so that the end portion 132a of the actuator 124a and the locking portion 140a of the latch 126a extend through the openings 156a in the side wall 44a, as illustrated in FIG. 20.

Figure 21:
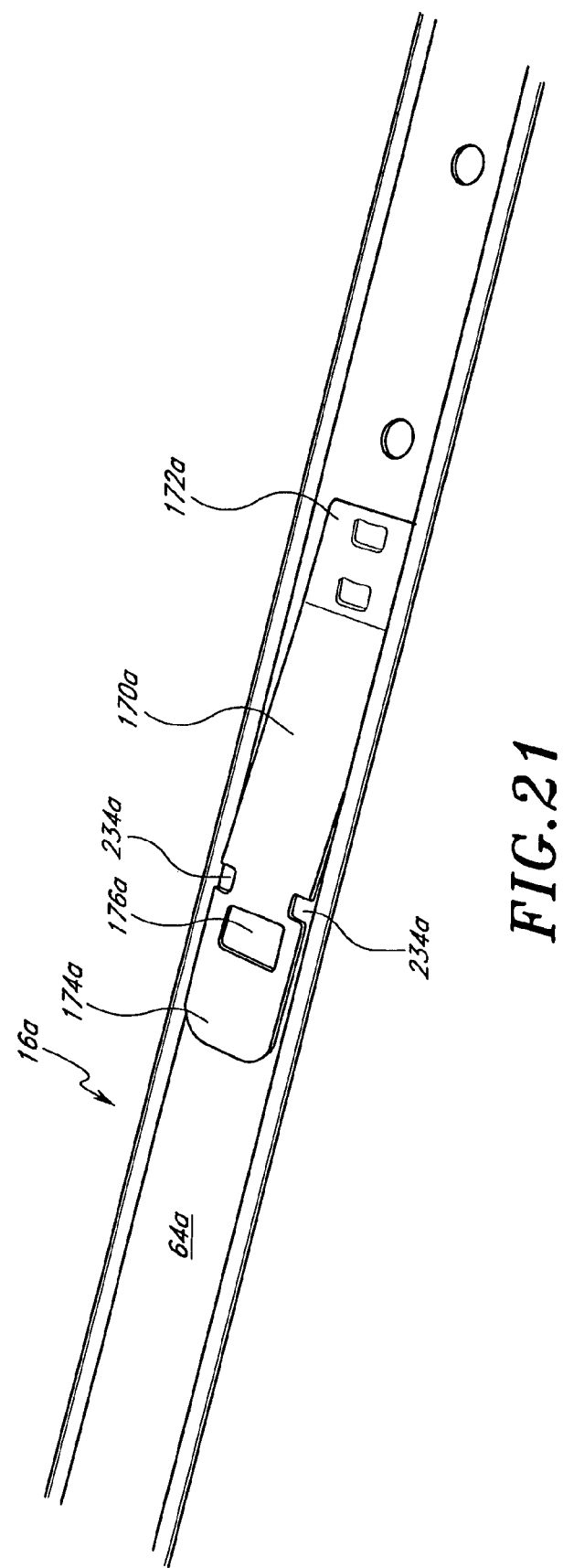
FIG. 21 is a perspective view of a portion of the inner slide segment and lock arm of the slide assembly of FIG. 17.

With reference now to FIG. 21, the inner slide segment 16a of the slide assembly 12a is shown. As in the previous embodiment, the inner slide segment 16a includes a lock arm 170a. The lock arm 170a is attached at a first end 172a to the inner surface of the side wall 64a of the inner slide segment 16a. An opening 176a is provided in the lock arm 170a near the second end 174a thereof. A pair of notches 234a desirably are provided in the upper and lower sides of the lock arm 170a just rearwardly of the opening 176a.

The latch 126a of the controller 120a operates in the same manner as in the previous embodiment to retain the bearing assembly 80a near the forward end of the channel 56a. The actuator 124a of the controller 120a likewise operates in a manner similar to that of the previous embodiment. Thus, in the alternative embodiment of FIGS. 17–21, to install the computer server in the server rack, the intermediate slide segment 18a is first fully retracted into the outer slide segment 20a. The side wall 28a of the outer slide segment 20a pushes the end portion 132a of the actuator 124a through the opening 156a in side wall 44a of the intermediate slide segment 18a. The inner slide segment 16a is then inserted into the channel 56a of the intermediate slide segment 18a and retracted. As the inner slide segment 16a is retracted, the end portion 132a of the actuator 124a contacts the lock arm 170a to prevent the lock arm 170a from engaging the engagement surface 188a of the intermediate slide segment 18a.

In the slide assembly 12 of the previous embodiment, the lock arm 170 does not engage the engagement surface 188 when the intermediate slide segment 18 is retracted in the outer slide segment 20 because the side wall 28 of the outer slide segment 20 pushes the end portion 132 of the actuator 124 through the opening 156 in the side wall 44 of the intermediate slide segment 18. As a result, there is a possibility that, when the slide assembly 12 is extended, the inner slide segment 16 can be entirely removed from the intermediate slide segment 18 before the intermediate slide segment 18 is extended with respect to the outer slide segment 20. If the inner slide segment 16 is extended before the intermediate slide segment 18, the lock arm 170 will not engage the engagement surface 188. The inner slide segment 16 and attached computer server may, therefore, be unintentionally detached from the rest of the slide assembly 12. If the person operating the slide assembly 12 is unprepared for this, the server might be dropped or otherwise damaged.

In the slide assembly 12a of FIGS. 17–21, when the intermediate slide segment 18a is retracted with respect to the outer slide segment 20a, the side wall 28a of the outer slide segment 20a contacts the end portion 132a of the actuator 124a. As in the previous embodiment, the end portion 132a of the actuator 124a extends through the opening 156a in the intermediate slide segment 18a and contacts the lock arm 170a so that the lock arm is unable to engage the engagement surface 188a of the intermediate slide segment 18a. In the slide assembly 12a of FIGS. 17–21, however, as the inner slide segment 16a is extended, the catch surfaces 228a of the catches 220a at the end portion 132a of the actuator 124a engage the notches 234a at the sides of the lock arm 170a to draw the intermediate slide segment 18a out of the outer slide segment 20a as the inner slide segment 16a is extended. When the intermediate slide segment 18a is extended from the outer slide segment 20a sufficiently that the side wall 28a of the outer slide segment 20a no longer contacts the end portion 132a of the actuator 124a, the actuator 124a resiliently returns to position and the catches 220a are disengaged from the notches 234a of the lock arm 170a. The inner slide segment 16a can then be extended further with respect to the intermediate slide segment 18a until the opening 176a in the lock arm 170a engages the engagement surface 188a of the intermediate slide segment 18a to lock the inner slide segment 16a with respect to the intermediate slide segment 18a.

Since the catches 220a at the end portion 132a of the actuator 124a cooperate with the notches 234a in the lock arm 170a to draw the intermediate slide segment 18a out of the outer slide segment 20a, there is no danger that the inner slide segment 16a will be entirely removed from the intermediate slide segment 18a before the intermediate slide segment 18a is extended with respect to the outer slide segment 20a. The catches 220a at the end portion 132a of the actuator 124a cooperate with the notches 234a in the lock arm 170a to prevent the unintentional detachment of the inner slide segment 16a and attached computer server from the rest of the slide assembly 12a.

To retract the slide assembly 12a again, the end portion 132a of the actuator 124a is manually pressed to release the lock arm 170a from the engagement surface 188a and thereby allow the inner slide segment 16a to be retracted into the intermediate slide segment 18a. As in the previous embodiment, because the lock arm 170a of the inner slide segment 16a can be released by pressing the actuator 124a instead of the lock arm 170a itself, there is no risk that the fingers of the operator will get pinched between the lock arm 170a and the intermediate slide segment 18a as the lock arm 170a is disengaged and the inner slide segment 16a is retracted. When the inner slide segment 16a is retracted, the forward end of the inner slide segment 16a actuates the lock (not shown) of the intermediate slide segment 18a to allow the intermediate slide segment 18a to be retracted with respect to the outer slide segment 20a.

Although the controllers 120, 120a of the illustrated embodiments advantageously combine the functions of both the actuator and the latch, it will be apparent to those skilled in the art that the actuator and the latch can each be used be used separately in a slide assembly. In addition, although each of the illustrated slide assembly embodiments includes an inner slide segment 16, 16a, an intermediate slide segment 18, 18a, and an outer slide segment 20, 20a, those skilled in the art will recognize that the latch function can be incorporated in slide assemblies having two or more slide segments. Thus, the latch function can be incorporated in slide assemblies having more than one intermediate slide segment, or no intermediate slide segment.

Accordingly, although the invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. Thus, it is intended that the scope of the present invention herein disclosed should not be limited by the particular disclosed embodiments described above, but should be determined only by a fair reading of the claims that follow.

What is claimed is:

1. A slide assembly, comprising:
 a first slide segment having a forward end, a rearward end and defining a channel;
 a second slide segment movable within said channel from a retracted position to an extended position relative to said first slide segment, said second slide segment being removable from said forward end of said first slide segment;

a bearing assembly configured to facilitate sliding movement of said second slide segment relative to said first slide segment, said bearing assembly being movable within said channel toward said forward end of said first slide segment along wit movement of said second slide segment toward said extended position, said bearing assembly defining a first engagement surface;

a latch defining a second engagement surface wherein said latch does not contact said bearing assembly when said second slide segment is in said retracted position relative to said first slide segment;

wherein, when said second slide segment is removed from engagement with said bearing assembly, said first engagement surface is positioned adjacent said second engagement surface such that upon rearward movement of said bearing assembly said second engagement surface contacts said first engagement surface to inhibit further rearward movement until said latch is contacted and biased to a release position by a component of said slide assembly other than said bearing assembly.

2. The slide assembly of claim 1, wherein said component is said second slide segment.

3. The slide assembly of claim 1, additionally comprising a third slide segment defining a channel, said first slide segment being movable within said channel of said third slide segment.

4. A slide assembly, comprising:

a first slide segment having a forward end, a rearward end and defining a channel;

a second slide segment movable within said channel from a retracted position to an extended position relative to said first slide segment, said second slide segment being removable from said forward end of said first slide segment;

a bearing assembly configured to facilitate sliding movement of said second slide segment relative to said first slide segment, said bearing assembly being movable within said channel toward said forward end of said first slide segment along with movement of said second slide segment toward said extended position, said bearing assembly defining a first engagement surface;

a latch defining a second engagement surface;

wherein, when said second slide segment is removed from engagement with said bearing assembly, said latch is moved from a first position towards a second position and then moves back towards said first position wherein said first engagement surface is positioned adjacent said second engagement surface such that upon rearward movement of said bearing assembly said second engagement surface contacts said first engagement surface to inhibit further rearward movement;

and wherein said first and second engagement surfaces are configured such that when a rearward force is applied to said bearing assembly, no force component is applied to said latch in a direction tending to move said latch towards said second position.

5. The slide assembly of claim 4, wherein said latch includes a first surface, wherein said beating assembly contacts said first surface when said second slide segment is removed from said first slide segment to bias said latch towards said second position.

6. The slide assembly of claim 4, additionally comprising a third slide segment defining a channel, said first slide segment being movable within said channel of said third slide segment.

7. A slide assembly, comprising:

a first slide segment having a forward end, a rearward end and defining channel;

a second slide segment movable within said channel from a retracted position to an extended position relative to said first slide segment, said second slide segment being removable from said forward end of said first slide segment;

a bearing assembly configured to facilitate sliding movement of said second slide segment relative to said first slide segment, said bearing assembly being movable within said channel toward said forward end of said first slide segment along with movement of said second slide segment toward said extended position, said bearing retainer defining a first engagement surface;

a latch defining a second engagement surface;

wherein, when said second slide segment is removed from engagement with said bearing assembly, said latch is moved from a first position towards a second position and then moves back towards said first position wherein said first engagement surface is positioned adjacent said second engagement surface such that upon rearward movement of said bearing assembly said second engagement surface contacts said first engagement surface to inhibit further rearward movement;

wherein said first and second engagement surfaces are configured such that when a rearward force is applied to said bearing assembly, no force component is applied to said latch in a direction tending to move said latch towards said second position, wherein said latch includes a first surface, wherein said bearing assembly contacts said first surface when said second slide segment is removed from said fast slide segment to bias said latch towards said second position; and wherein said latch additionally includes a second surface and said second slide segment comprises a tab, said tab configured to contact said second surface and bias said latch towards said second position when said second slide segment is inserted into said channel and moved towards said rearward end of said first slide segment, thereby releasing said bearing assembly from said latch and permitting rearward movement of said bearing assembly.

8. The slide assembly of claim 7, wherein said first surface is inclined with respect to a longitudinal axis of said slide assembly.

9. The slide assembly of claim 8, wherein said second surface is inclined with respect to a longitudinal axis of said slide assembly.

10. The slide assembly of claim 7, wherein said tab is spaced from a rearward end of said second slide segment.

11. A slide assembly, comprising:

a first slide segment having a forward end, a rearward end and defining a channel;

a second slide segment movable within said channel from a retracted position to an extended position relative to said first slide segment, said second slide segment being removable from said forward end of said first slide segment;

a bearing assembly configured to facilitate sliding movement of said second slide segment relative to said first slide segment, said bearing assembly being movable within said channel toward said forward end of said first slide segment along with movement of said second slide segment toward said extended position;

a latch secured proximate a forward end of said first slide segment; wherein, during removal of said second slide segment from said first slide segment, said bearing assembly moves into a locked position relative to said first slide segment wherein rearward movement of said bearing assembly relative to said first slide segment is blocked by said latch, said bearing assembly and said latch being configured such that said bearing assembly is not released from said locked position in response to a rearward force exerted on said bearing retainer, wherein a component of said slide assembly other than said bearing retainer is configured to move said latch to release said bearing assembly from said locked position daring reinsertion of said second slide segment into said first slide segment.

12. The slide assembly of claim 11, wherein said component is said second slide segment.

13. The slide assembly of claim 11, additionally comprising a third slide segment defining a channel, said first slide segment being movable within said channel of said third slide segment.

14. A slide assembly, comprising:
a first slide segment;
a second slide segment movable from a retracted position to an extended position relative to said first slide segment and being removable from a forward end of said first slide segment, said second slide segment comprising a tab;
a bearing assembly configured to facilitate sliding movement of said second slide segment relative to said first slide segment, said bearing assembly being movable toward said forward end of said first slide segment along with movement of said second slide segment toward said extended position, said bearing assembly defining a first engagement surface;
a latch secured proximate a forward end of said first slide segment, wherein said latch does not contact said bearing assembly when said second slide segment is in said retracted position relative to said first slide segment, said latch defining a second engagement surface, said latch being movable between a first position wherein said second engagement surface is positioned adjacent said first engagement surface to inhibit rearward movement of said bearing assembly and a second position wherein rearward movement of said bearing assembly is permitted;
wherein when said second slide segment is inserted into said channel and moved toward a rearward end of said first slide segment said tab is configured, if said latch is in said first position, to contact said first surface and move said latch from said first position toward said second position.

15. The slide assembly of claim 14, wherein said latch is configured to remain in said first position to inhibit rearward movement of said beating assembly until said latch is moved toward said second position by said tab.

16. The slide assembly of claim 14, additionally comprising a third slide segment defining a channel, said first slide segment being movable within said channel of said third slide segment.

17. The slide assembly of claim 14, wherein said first surface is inclined with respect to a longitudinal axis of said slide assembly.

18. The slide assembly of claim 14, wherein said tab is spaced from a rearward end of said second slide segment.

* * * * *